(12) United States Patent
Wojtecki et al.

(10) Patent No.: US 11,882,770 B2
(45) Date of Patent: Jan. 23, 2024

(54) AREA-SELECTIVE DEPOSITION OF METAL NITRIDE TO FABRICATE DEVICES

(71) Applicant: International Business Machines Corporation, Armonk, NY (US)

(72) Inventors: Rudy J. Wojtecki, San Jose, CA (US); Damon Brooks Farmer, White Plains, NY (US); Charles Thomas Rettner, San Jose, CA (US); Noel Arellano, Gilroy, CA (US); Alexander Friz, San Jose, CA (US); Matthew W. Copel, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 651 days.

(21) Appl. No.: 17/118,192

(22) Filed: Dec. 10, 2020

(65) Prior Publication Data

US 2022/0190229 A1   Jun. 16, 2022

(51) Int. Cl.
  *H10N 60/01* (2023.01)
(52) U.S. Cl.
  CPC .............................. *H10N 60/0241* (2023.02)
(58) Field of Classification Search
  CPC ............ H10N 60/0241; H10N 60/0912; C23C 14/0605; C23C 16/04; C23C 16/34; Y10T 29/49014
  See application file for complete search history.

(56) References Cited

U.S. PATENT DOCUMENTS

| 4,657,776 | A | 4/1987 | Dietrich et al. |
| 5,138,401 | A | 8/1992 | Yamazaki |
| 9,997,357 | B2 | 6/2018 | Arghavani et al. |
| 10,658,424 | B2 * | 5/2020 | Oliver ................... G06N 10/00 |
| 2006/0017132 | A1 | 1/2006 | Birner et al. |
| 2008/0265415 | A1 * | 10/2008 | Colburn .............. H01L 21/0331 257/750 |
| 2009/0309230 | A1 * | 12/2009 | Cui ................... H01L 23/53238 257/773 |
| 2015/0179914 | A1 | 6/2015 | Greer et al. |

FOREIGN PATENT DOCUMENTS

CN        103367516        10/2013

OTHER PUBLICATIONS

Brichon et al., "MD simulations of low energy Clx+ ions interaction with ultrathin silicon layers for advanced etch processes," Journal of Vacuum Science & Technology A Vacuum Surfaces and Films 32(2):021301-021301-7; Mar. 2014, 9 pages.

(Continued)

*Primary Examiner* — Donghai D Nguyen
(74) *Attorney, Agent, or Firm* — Amin, Turocy & Watson, LLP

(57) ABSTRACT

Embodiments are provided for fabrication of superconducting devices using area-selective deposition of a metal nitride. In some embodiments, a method can include providing a thermally treated carbon layer, and selectively depositing a metal nitride using the thermally treated carbon layer for formation of a superconducting device.

20 Claims, 16 Drawing Sheets
(7 of 16 Drawing Sheet(s) Filed in Color)

(56) References Cited

OTHER PUBLICATIONS

Sandberg et al., "Etch Induced Microwave Losses in Titanium Nitride Superconducting Resonators," arXiv:1205.3153 [cond-mat.supr-con]; May 14, 2012, 14 pages.

Quintana et al., "Characterization and reduction of microfabrication-induced decoherence in superconducting quantum circuits," arXiv:1407.4769 [cond-mat.mes-hall], Jul. 17, 2014; 6 pages.

Stevens et al., "Area-Selective Atomic Layer Deposition of TiN, TiO2, and HfO2 on Silicon Nitride with inhibition on Amorphous Carbon," Chem. Mater. 2018, 30, 10, 3223-3232, 10 pages.

Wojtecki et al., "15nm Resolved Patterns in Selective Area Atomic Layer Deposition—Defectivity Reduction by Monolayer Design," ACS Appl. Mater. Interfaces 2018, 10, 44, 38630-38637; 9 pages.

Wang et al., "Titanium Dioxide/Lithium Phosphate Nanocomposite Derived from Atomic Layer Deposition as a High-Performance Anode for Lithium Ion Batteries," Adv. Mater. Interfaces 3(21) (2016), 1600369; 8 pages.

Meng et al., "Emerging Applications of Atomic Layer Deposition for Lithium-Ion Battery Studies," Adv. Mater. 24(27) (2012); 27 pages.

Jang et al., "Fabrication and deformation of three-dimensional hollow ceramic nanostructures," Nature Materials 12; Sep. 1, 2013; 6 pages.

Narasimha et al., "22nm High-Performance SOI Technology Featuring Dual-Embedded Stressors, EpiPlate High-K Deep-Trench Embedded DRAM and Self-Aligned via 15LM BEOL," Electron Devices Meeting (IEDM), International 2012; 4 pages.

Mackus et al., "The use of atomic layer deposition in advanced nanopatterning," Nanoscale 6(19) (2014) 10941-10960; 20 pages.

Johnson et al., "A brief review of atomic layer deposition: from fundamentals to applications," Materials Today 17(5) (2014) 236-246; 11 pages.

Leskela et al., "Atomic layer deposition (ALD): from precursors to thin film structures," Thin Solid Films 409 (2002) 138-146; 9 pages.

Kim et al., "Review of plasma-enhanced atomic layer deposition: Technical enabler of nanoscale device fabrication," Jpn. J. Appl. Phys. 53 (2014), 03DA01-8; 8 pages.

Tao et al., "Selective atomic layer deposition of HfO 2 on copper patterned silicon substrates," Appl. Phys. Lett. 96 (2010), 192105; 4 pages.

George et al., "Surface Chemistry for Molecular Layer Deposition of Organic and Hybrid Organic-Inorganic Polymers," Polymers. Acc. Chem. Res. 42(4) (2009) 498-508; 11 pages.

Mackus et al., "From the Bottom-up: Toward Area-Selective Atomic Layer Deposition with High Selectivity," Chem. of Mater. 31(1) (2019) 2-12.

Peng et al., "A Route to Nanoscopic Materials via Sequential Infiltration Synthesis on Block Copolymer Templates," ACS Nano 5(6) (2011) 4600-4606.

Kamcev et al., "Chemically Enhancing Block Copolymers for Block-Selective Synthesis of Self-Assembled Metal Oxide Nanostructures," ACS Nano 7(1) (2013) 339-346.

Farm et al., "Selective-Area Atomic Layer Deposition Using Poly(methyl methacrylate) Films as Mask Layers," J. Phys. Chem. C 112 (2008) 15791-15795.

Mameli et al., "Area-Selective Atomic Layer Deposition of ZnO by Area Activation Using Electron Beam-Induced Deposition," Chem. Mater. 31(4) (2019) 1250-1257.

Hashemi et al., "A New Resist for Area Selective Atomic and Molecular Layer Deposition on Metal-Dielectric Patterns," J. Phys. Chem. C 118 (2014) 10957-10962.

Jiang et al., "Area-Selective Atomic Layer Deposition of Platinum on YSZ Substrates Using Microcontact Printed SAMs," J. Electrochem. Soc. 154(12) (2007) D648-D656; 9 pages.

Chen et al., "Investigation of Self-Assembled Monolayer Resists for Hafnium Dioxide Atomic Layer Deposition," Chem. Mater. 17(3), (2005) 536-544.

Hashemi et al., "Sequential Regeneration of Self-Assembled Monolayers for Highly Selective Atomic Layer Deposition," Adv. Mater. Inter. 3(21) (2016), 1600464; 7 pages.

Chen et al., "Highly Stable Monolayer Resists for Atomic Layer Deposition on Germanium and Silicon," Chem. Mater. 18 (2006) 3733-3741.

Prasittichai et al., "Improving Area-Selective Molecular Layer Deposition by Selective SAM Removal," Appl. Mater. Interfaces 6(20) (2014) 17831-17836.

Ferrari et al., "Interpretation of Raman spectra of disordered and amorphous carbon," Phys. Rev. B, 61(20), 2000, 14095-14107.

Elkind, "Ion mill damage in nHgCdTe," J. Vac. Sci. Technol., B: Micro. Proc. Phenom. 1992, 10, 1460; 7 pages.

Bendias et al., "High Mobility HgTe Microstructures for Quantum Spin Hall Studies," Nano Lett., 2018, 18(8), 4831-4836.

Mettry et al., "Extending the compositional diversity of films in area selective atomic layer deposition through chemical functionalities," Journal of Vacuum Science & Technology A 37, 020923 (2019); 10 pages.

Pattison et al., "Surface Initiated Polymer Thin Films for the Area Selective Deposition and Etching of Metal Oxides," ACS Nano 2020, 14, 4, 4276-4288.

\* cited by examiner

AREA-SELECTIVE DEPOSITION OF METAL NITRIDE TO FABRICATE DEVICES

BACKGROUND

The subject disclosure relates to fabrication of superconducting devices using area-selective deposition of a metal nitride.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later.

According to an embodiment, a method is provided. The method includes providing a thermally treated carbon layer. The method also includes selectively depositing a metal nitride using the thermally treated carbon layer for formation of a superconducting device.

According to another embodiment, a method is provided. The method includes annealing a pattern of carbonaceous sections present in a layer of carbon at a temperature within a range from about 500° C. to about 1000° C. The method also includes selectively depositing a metal nitride using the annealed pattern to form a superconducting device.

According to yet another embodiment, a method is provided. The method includes forming a first electrode by selectively depositing a metal nitride using a thermally treated carbon layer. The method also includes forming an insulator layer using the thermally treated carbon layer. The insulator layer forms a first interface with the first electrode. The method further includes forming a second electrode by selectively depositing the metal nitride using the thermally treated carbon layer. The second electrode forms a second interface with the insulator layer.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIG. 6A illustrates a non-limiting example of a substrate having an inhibiting carbon layer in accordance with one or more embodiments described herein.

FIG. 6B illustrates a structure having metal nitride sections selectively deposited on growth regions present in the substrate shown in FIG. 6A, in accordance with one or more embodiments described herein.

FIG. 6C illustrates a structure resulting from removal of carbonaceous sections present in the structure shown in FIG. 6B, in accordance with one or more embodiments described herein.

FIG. 7A illustrates a non-limiting example of a substrate in accordance with one or more embodiments described herein.

FIG. 7B illustrates the substrate shown in FIG. 7A after a cleaning substage has been implemented, in accordance with one or more embodiments described herein.

FIG. 7C illustrates a non-limiting example of a treated substrate after the clean substrate shown in FIG. 7B has been coated with a photoresist in accordance with one or more embodiments described herein.

FIG. 7D illustrates a non-limiting example of the treated substrate shown in FIG. 7C after another cleaning substage has been implemented, in accordance with one or more embodiments described herein.

FIG. 7E illustrates a non-limiting example of a second treated substrate resulting from depositing carbon on the treated substrate shown in FIG. 7D, in accordance with one or more embodiments described herein.

FIG. 7F illustrates a non-limiting example of a resulting carbon layer after removing photoresist sections from the second treated substrate shown in FIG. 7E, in accordance with one or more embodiments described herein.

DETAILED DESCRIPTION

Figure 1:
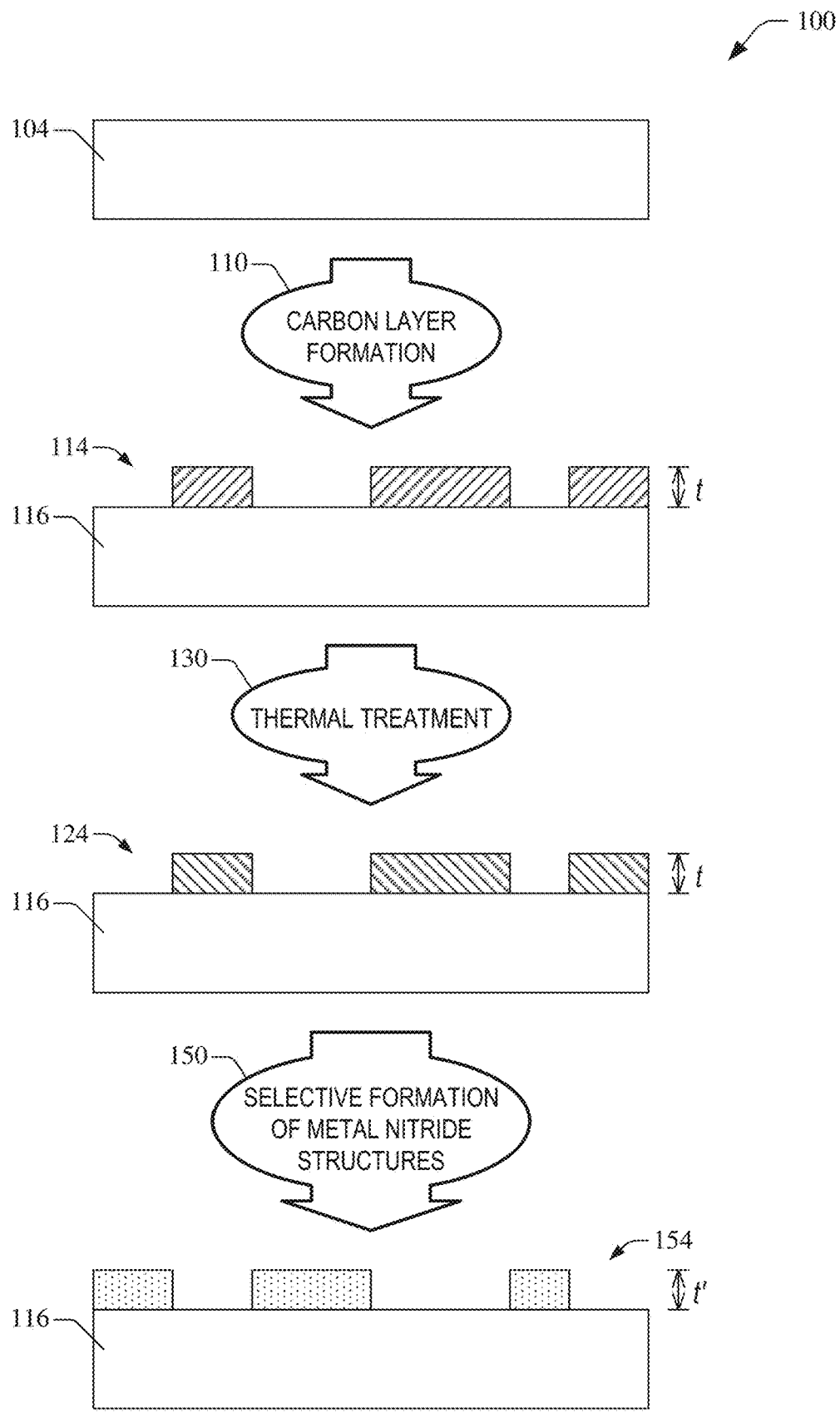
FIG. 1 illustrates a non-limiting example of a fabrication process for superconducting devices, in accordance with one or more embodiments described herein.

Embodiments of this disclosure address the fabrication of superconducting devices. Superconducting devices underpin many quantum technologies, such as magnetic-field sensors (e.g., superconducting quantum interference devices (SQUIDs)) produced from materials such as niobium and aluminum; and superconducting transmon devices for quantum computers. The fabrication of these devices typically relies on subtractive fabrication processes that can damage the sidewalls of metal and adjacent substrate. Such damage can result in loss of device performance. In some subtractive approaches to device fabrication, the dry etching involved in the patterning of superconducting titanium nitride commonly utilized during the fabrication of superconducting microwave resonators can induce microwave losses. Those losses can be attributed to redistribution of silicon onto photoresist and sidewalls of titanium nitride structures that have been formed. In other subtractive approaches, subjecting epitaxially formed superconducting films to patterning steps typically results in substantial damage to the underlying crystal lattice of the film.

Embodiments described herein provide an additive fabrication approach to forming superconducting devices. Such an approach includes forming of a layer of carbon having a pattern of carbonaceous sections, and then subjecting the layer of carbon to a thermal treatment. Such a treatment includes annealing the layer of carbon during a defined period of time at a temperature greater than about 500° C., for example. The thermal treatment yields a thermally treated carbon layer that preserves the pattern of carbonaceous sections and has inhibiting characteristics that preclude the growth of a metal nitride on those sections. Accordingly, deposition of the metal nitride on the thermally treated carbon layer can result in the selective growth of metal nitride layers on regions that separate the thermally treated carbonaceous sections in the pattern. Therefore, the thermally treated carbon layer can serve as a growth inhibitor layer that can be utilized for area-selective deposition of metal nitrides.

Because of the area-selectivity in the deposition of the metal nitride, the pattern of carbonaceous sections present in the untreated layer of carbon can ultimately dictate the structure and type of the superconducting device that is fabricated. In some cases, the area-selectivity of a thermally treated layer of carbon can be preserved for a large number of atomic layer deposition (ALD) cycles, which can yield metal nitride structures having thickness of up to about 80 nm.

Embodiments described herein provide several advantages over commonplace substrative approaches to form superconducting devices. For example, because the additive fabrication approach described herein avoids high-energy processes, an advantage includes the avoidance of damage to substrate and/or sidewalls during the fabrication of a superconducting device. Therefore, as another advantage, the additive fabrication process of this disclosure can be used to produce superconducting devices having higher performance, without limitations from losses that are typical of subtractive fabrication processes.

With reference to the drawings, FIG. 1 illustrates a non-limiting example of a fabrication process 100 to fabricate superconducting devices in accordance with one or more embodiments described herein. The fabrication process 100 can include multiple fabrication stages. As is illustrated in FIG. 1, the multiple fabrication stages can include a carbon layer formation stage 110. The carbon layer formation stage 110 includes treating a substrate 104. The substrate 104 can be embodied in, or can include, a slab of one of many types of solid materials, such as Si, Ge, a nitride (e.g., SiN), sapphire, a III-V semiconductor, a II-VI semiconductor, or similar. The slab can be embodied in a wafer of a defined diameter, for example. In some embodiments, the substrate 104 can include a Si substrate or a sapphire substrate. In other embodiments, the substrate 104 can include a $SiO_2$ substrate or a SiN substrate. In still other embodiments, the substrate 104 can include a metal thin film substrate that can be overlaid onto a slab of another material, such Si, Ge, a III-V semiconductor, a II-VI semiconductor, or similar.

The carbon layer formation stage 110 can include treating the substrate 104 with an acid and subsequently depositing carbon onto the substrate 104. By treating the substrate 104 with the acid prior to depositing the carbon, satisfactory adhesion between deposited carbon and substrate can be achieved after carbon deposition. In one embodiment, the substrate 104 can be embodied in a silicon substrate that can be treated with hydrofluoric acid (e.g., a solution of hydrogen fluoride (HF) and water). The silicon substrate can be a four-inch silicon wafer or an eight-inch silicon wafer, for example. Treating such a silicon substrate with the hydrofluoric acid can remove native $SiO_2$ layers and, thus, can provide satisfactory adhesion of the carbon that is deposited on a silicon surface.

The carbon can be deposited onto the treated substrate 104 by using a physical vapor deposition (PVD) process, such as an electron-beam evaporation process. In some configurations, the electron-beam evaporation process can include maintaining a base pressure at about $10^{-7}$ Torr within a deposition chamber, and using a focused electron beam directed to a carbon target that is the source of carbon. The carbon target can include a target of graphite, in some cases. The carbon that is so deposited can form a layer of amorphous carbon having a uniform thickness t. In some embodiments, a magnitude of the thickness t can be in a range from about 30 nm to about 100 nm. In some embodiments, thinner layers of amorphous carbon can be ablated during plasma enhanced processes that may be included in subsequent stages of the fabrication process 100. Ablation of a layer of an amorphous carbon results in the loss of the area selectivity described herein. It is noted that using a chemical vapor deposition (CVD) process for the deposition of carbon yields negligible area selectively.

Figure 2:
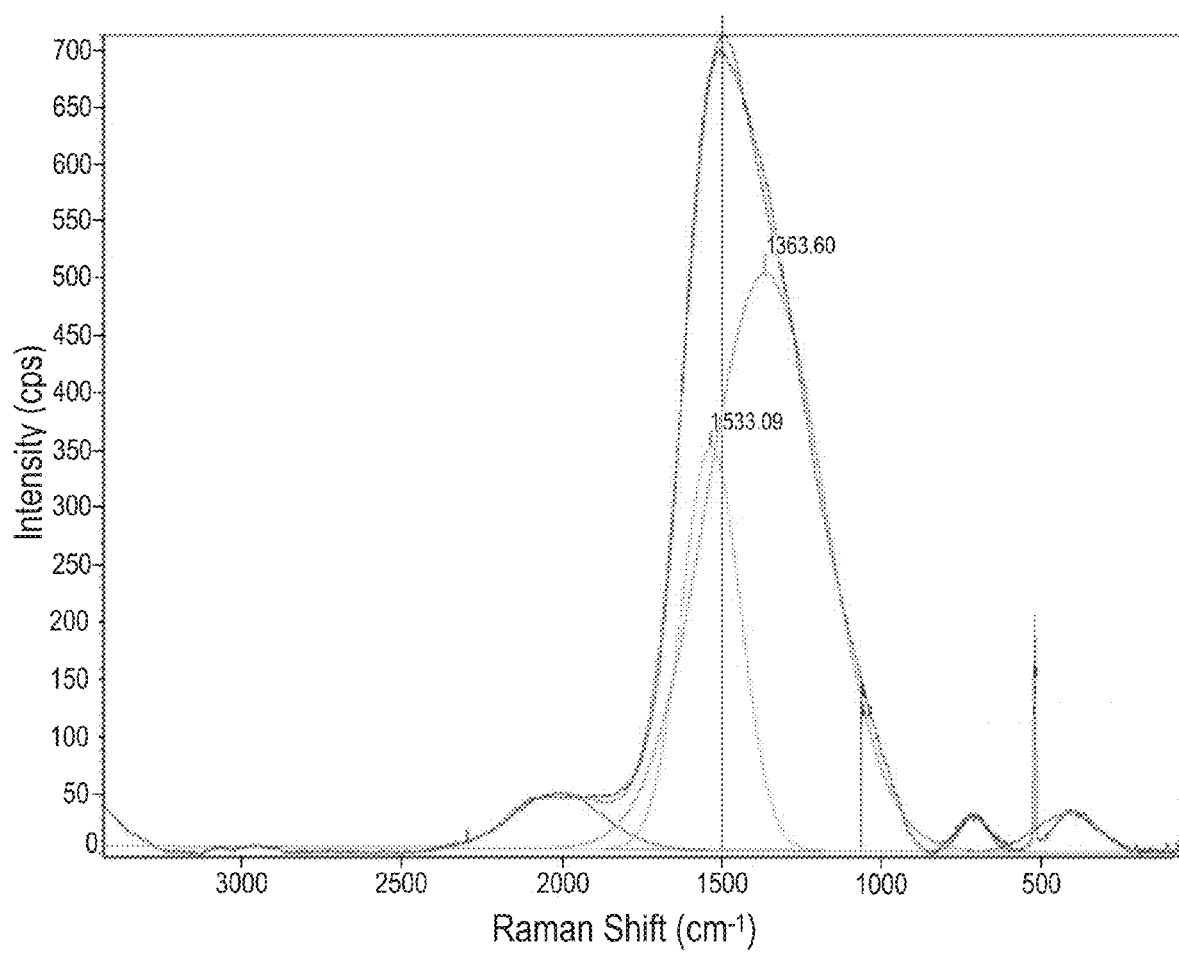
FIG. 2 illustrates a non-limiting example of a Raman spectrum of an example of an amorphous carbon film, in accordance with one or more embodiments described herein.

In embodiments in which the silicon substrate 104 is embodied in a silicon substrate, the layer of amorphous carbon can include about 20% of $sp^3$-hybridized carbon-carbon bonds, as it can be gleaned from Raman spectroscopy of an as-deposited amount of carbon. More concretely, FIG. 2 illustrates a Raman spectrum (red trace) of an as-deposited layer of carbon on a silicon substrate. A prominent peak is observed at about 1533 $cm^{-1}$. Shoulder peaks about the prominent peak are observed at both higher and lower Raman shifts. The shoulder peaks reveal that the as-deposited layer of carbon can be a disordered carbon film with about 20% of $sp^3$-hybridized carbon-carbon bonds.

Accordingly, with further reference to FIG. 1, treating the substrate 104 can result in an amorphous carbon layer 114 that has the uniform thickness t and is overlaid on a surface of the treated substrate 104 (depicted as a substrate 116 in FIG. 1). The amorphous carbon layer 114 can define a pattern of carbonaceous sections, as is depicted in FIG. 1. Those sections can be separated by regions that are devoid of carbon and expose one or several surfaces of the substrate 116. Each one of such regions can be referred to as a growth region.

In addition to disorder, defects can be present in the amorphous carbon layer 114. The defects can include, for example, dangling bonds, stressed bonds, and vacancies. At least some of the defects can originate from the high energy that is utilized to evaporate carbon from the carbon target (e.g., a graphite target). Hence, the fabrication process 100 also can include a thermal treatment stage 130 in which the amorphous carbon layer 114 can be annealed. The amorphous carbon layer 114 can be annealed in a reducing environment, such as a forming gas atmosphere (e.g., a mixture of 5% $H_2$ in $N_2$). Annealing the amorphous carbon layer 114 in such an environment can provide enough energy to cause the relaxation of bonds and the capping of dangling bonds, and to produce a more ordered form of carbon. In some embodiments, the amorphous carbon layer 114 can be annealed at a defined temperature $T_a$ in a tube furnace under a flow of the forming gas for a defined period $\Delta t$. The amorphous carbon layer 114 can then be allowed to cool to room temperature within the tube furnace. The magnitude of $\Delta t$ can be within a range from about two hours to about four hours. The magnitude of $T_a$ can be within a range from about 500° C. to about 1000° C., for example, to yield an inhibiting carbon layer. In one embodiment, $T_a$ can be about 900° C. and $\Delta t$ can be about three hours.

Annealing the amorphous carbon layer 114 can preserve the spatial distribution of carbonaceous sections in the pattern defined by the amorphous carbon layer 114. Thus, annealing that pattern can yield an inhibiting carbon layer 124 that also is patterned and includes one or several growth regions. The annealing also can reduce the amount of disorder that is present in the amorphous carbon layer 114, thus providing significantly higher ordering in the inhibiting carbon layer 124. The higher ordering can arise from a higher proportion of $sp^2$-hybridized carbon in the inhibiting carbon layer 124 relative to that in the amorphous carbon layer 114, as is observed in EELS experiments.

Figure 3A:
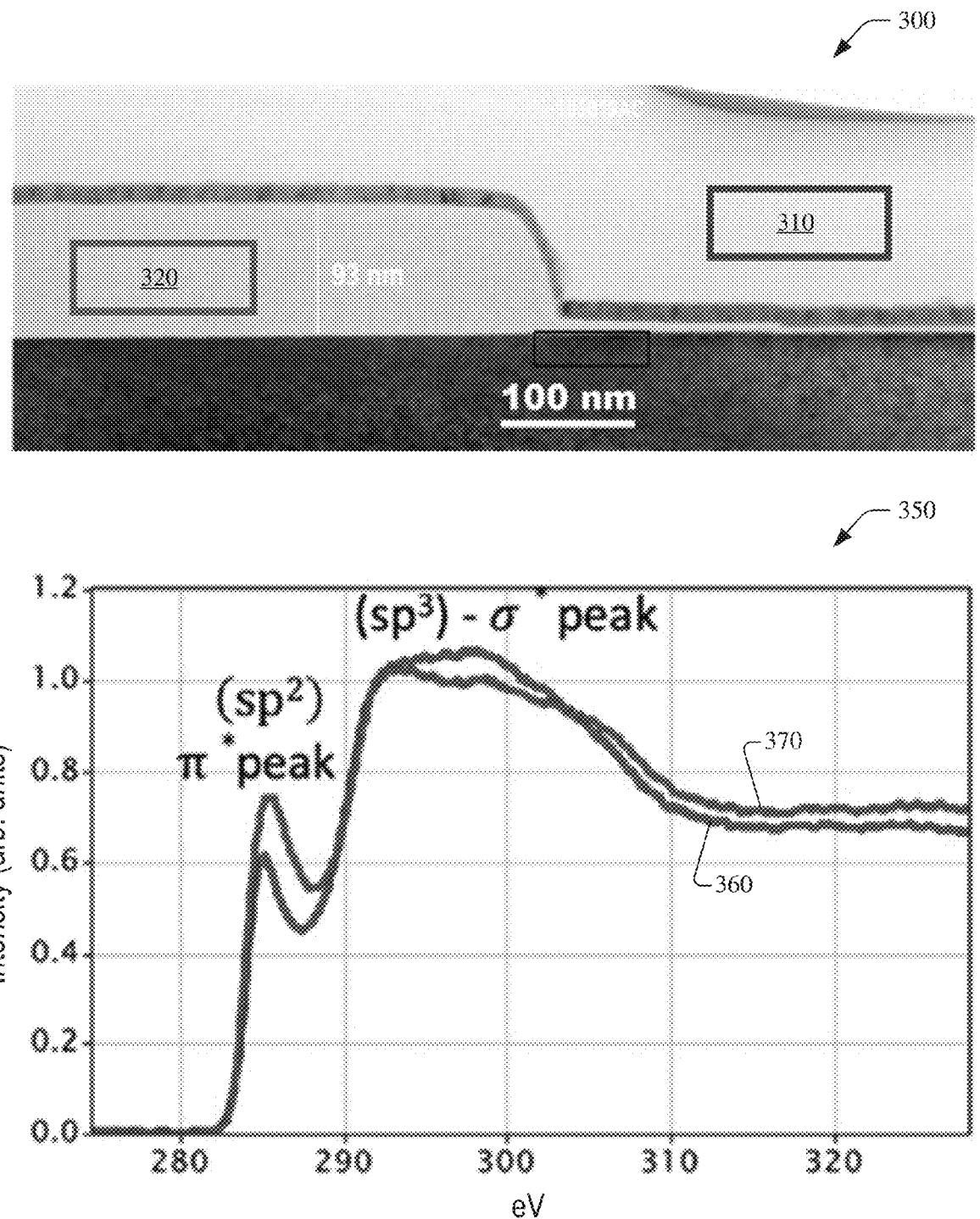
FIG. 3A illustrates a non-limiting example of a scanning transmission electron microscopy (STEM) image of a sample containing as-deposited amorphous carbon and annealed amorphous carbon, and also illustrates electron energy loss spectroscopy (EELS) spectra for a region encompassing as-deposited amorphous carbon and a region encompassing annealed amorphous carbon, in accordance with one or more embodiments described herein.

More concretely, as is shown in FIG. 3A, a sample including annealed amorphous carbon and as-deposited amorphous carbon can be probed using EELS. An image 300 of the sample presents two regions probed using EELS: A first region 310 (blue rectangle) encompassing as-deposited amorphous carbon, and a second a second region 320 (red rectangle) encompassing annealed amorphous carbon. The as-deposited amorphous carbon can be referred to as untreated amorphous carbon because such carbon is not subjected to a thermal treatment after deposition. The annealed amorphous carbon has been annealed in accordance with aspects describe above. The first region 310 exhibits a first electron energy loss spectrum 360 (blue trace) as is shown in plot 350. The first electron energy loss spectrum 360 presents a $\pi^*$ peak at about 285 eV corresponding to $sp^2$-hybridzed C—C bonds, and a broad $\sigma^*$ peak corresponding to $sp^3$-hybridized C—C bonds. The second region 320 exhibits a second electron energy loss spectrum 370 (red trace) as is shown in plot 350. The second electron energy loss spectrum 370 also presents a $\pi C^*$ peak at about 285 eV corresponding to $sp^2$-hybridzed C—C bonds, and a broad $\sigma^*$ peak corresponding to $sp^3$-hybridized C—C bonds. The $\pi^*$ peak in the second electron energy loss spectrum 370, however, has an increased intensity relative to the $\pi^*$ peak in the first electron energy loss spectrum 360. Without intending to be bound by conjecture, the increased intensity is consistent with a higher volume of $sp^2$-hybridzed C—C bonds in the annealed amorphous carbon.

Figure 3B:
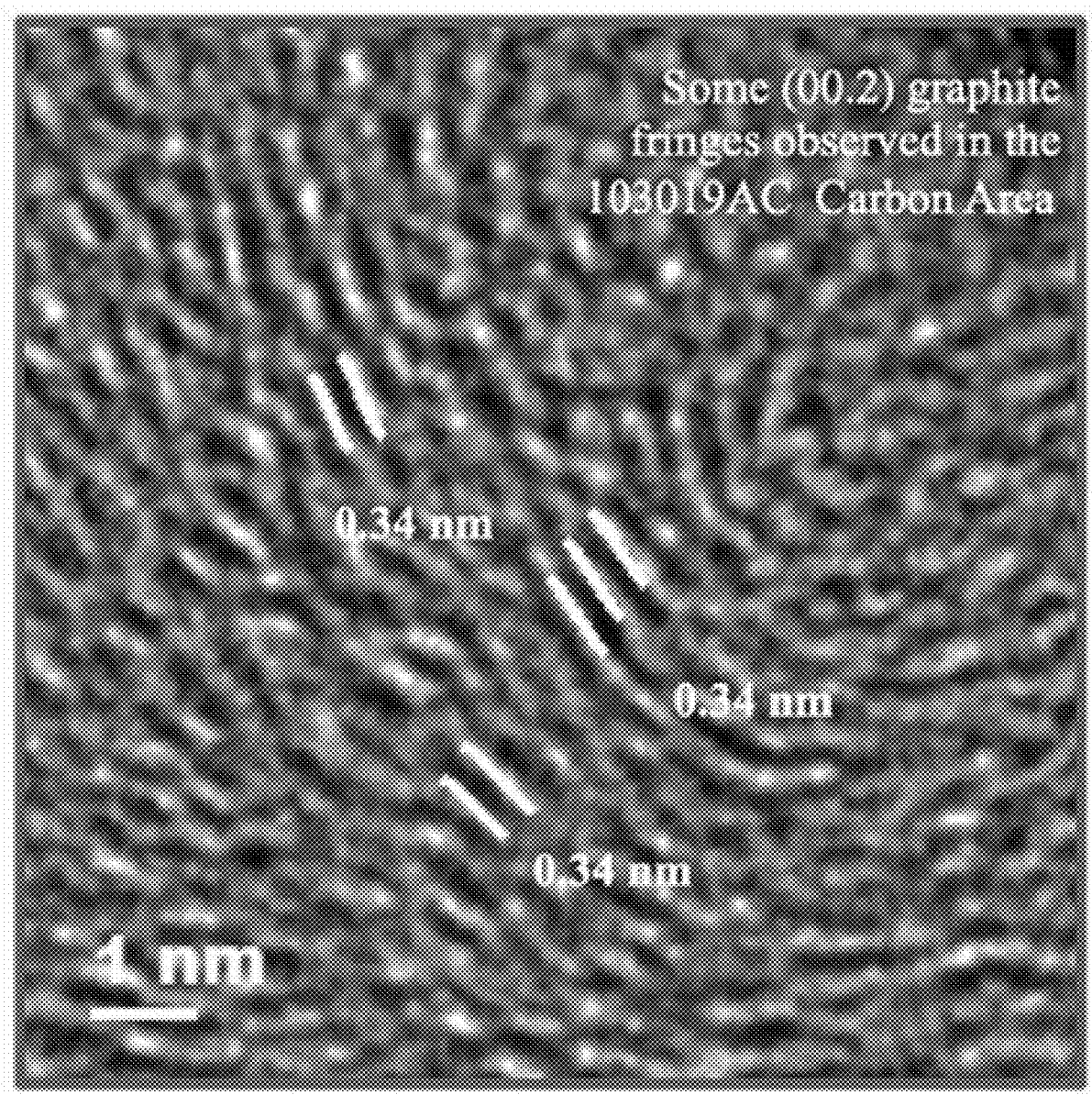
FIG. 3B illustrates a non-limiting example of a STEM image of a region encompassing annealed amorphous carbon in accordance with one or more embodiments described herein.

Scanning transmission electron microscopy (STEM) experiments also reveal higher ordering in annealed amorphous carbon relative to untreated amorphous carbon that has been deposited in accordance with this disclosure. As is shown in FIG. 3B, a STEM image of a region of annealed amorphous carbon reveals graphitic fringes that are oriented along crystallographic direction (002) and exhibit a measurable spacing between layers of carbon. That spacing can be about 0.34 nm.

The inhibitory properties of the annealed carbonaceous sections and the presence of growth region(s) in the inhibiting carbon layer 124 can permit area-selective deposition of a metal nitride. That is, the pattern of annealed carbonaceous sections can prevent the growth of the metal nitride on respective surfaces of the annealed carbonaceous sections. Thus, the metal nitride can be deposited in the growth regions defined by the inhibiting carbon layer 124.

Figure 4:
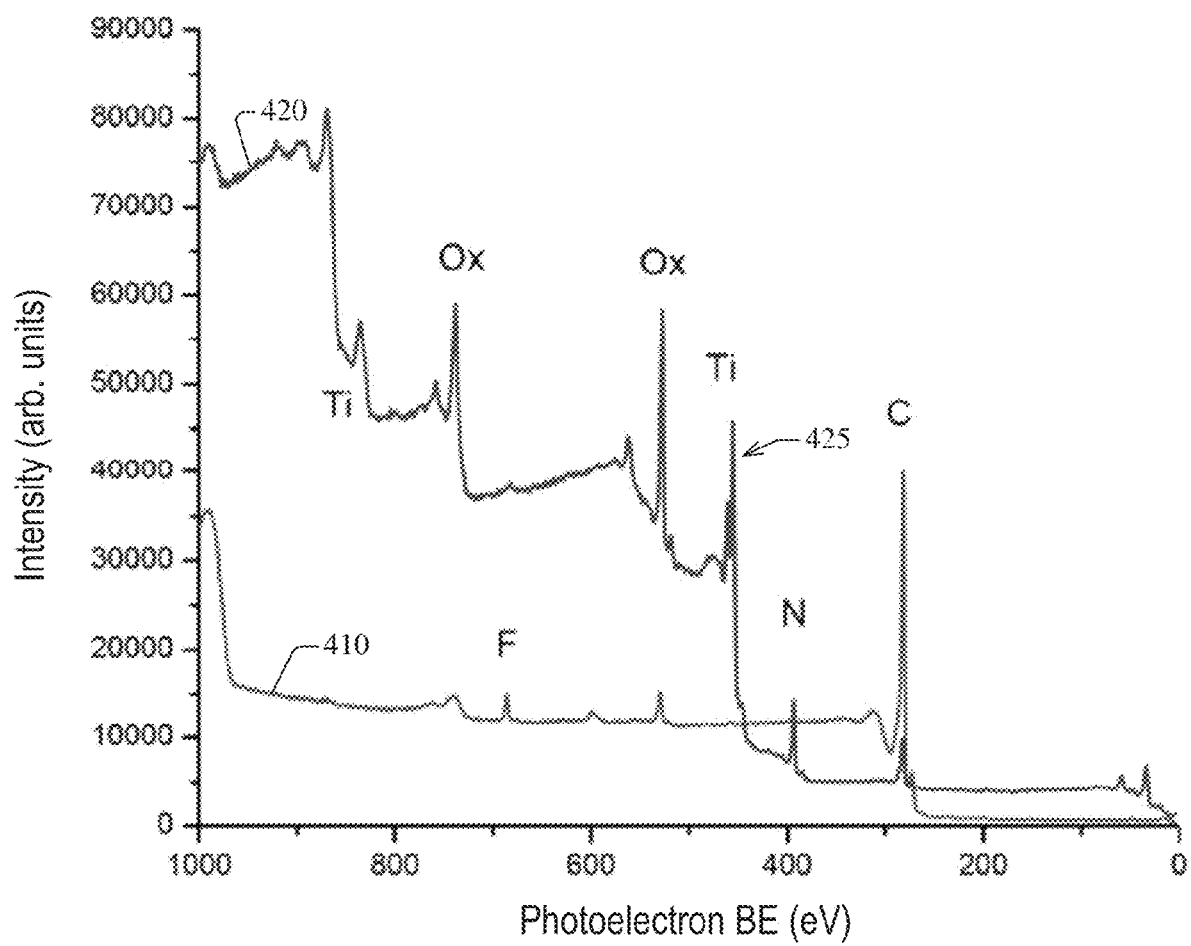
FIG. 4 illustrates non-limiting examples of X-ray photoelectron spectroscopy (XPS) spectra of annealed carbon sample after 1000 atomic layer deposition (ALD) cycles of $TiN_3$ (red trace) compared to an untreated Si surface (blue trace), in accordance with one or more embodiments described herein.

Such inhibitory properties can be gleaned from XPS of a metal nitride deposited on an amorphous carbon thin film, as is shown in FIG. 4. An electron-beam evaporation process similar to the process used to form the amorphous carbon layer 114 can be used to form the amorphous carbon thin film. The amorphous carbon thin film also has been subjected to the thermal treatment stage 130. In some embodiments, an ALD process can be used for the deposition of $TiN_3$ from the half reactions of titanium chloride ($TiCl_4$) and ammonia ($NH_3$) at a temperature of about 300° C. Such an ALD process exhibits a growth rate of about 0.4 nm/cycle. FIG. 4 illustrates an XPS spectrum 410 (red trace) of the annealed carbon thin film after 1000 ALD cycles of $TiN_3$. The XPS spectrum 410 conveys no observable Ti at the surface of the annealed carbon film. In comparison, FIG. 4 also illustrates an XPS spectrum 420 (blue trace) of a control carbon thin film grown on an untreated Si substrate. A prominent Ti peak 425 can be observed in the XPS spectrum 420. It is noted that untreated carbon thin films exhibit limited selectivity towards the ALD conditions mentioned above. In such thin films what has been observed is a change in the film growth mechanism from a continuous layer-by-layer film formation to an island growth mechanism.

Further, selectivity of the inhibiting carbon layer 124 can be confirmed using transmission electron microscopy (TEM) to examine morphology and EELS experiments to examine elemental composition. In one embodiment, a sample of the inhibiting carbon layer 124 can be prepared for TEM experiments by coating the inhibiting carbon layer 124 with a copper thin film and then depositing a layer of amorphous carbon in accordance with the carbon layer formation stage 110. The copper thin film can be deposited using thermal evaporation of a Cu source. In the experiments, the copper-carbon interface permits distinguishing between the annealed carbon present in the inhibiting carbon layer 124 and subsequently deposited amorphous carbon. The sample can be further prepared by depositing, using an ALD process, $TiN_3$ from the half thermal reactions of $TiCl_4$ and $NH_3$ at a temperature of about 300° C. Such an ALD process exhibits a growth rate of about 0.4 nm/cycle on a blanket growth surface, such as Si, SiOx, without inhibiting layer(s).

Figure 5A:
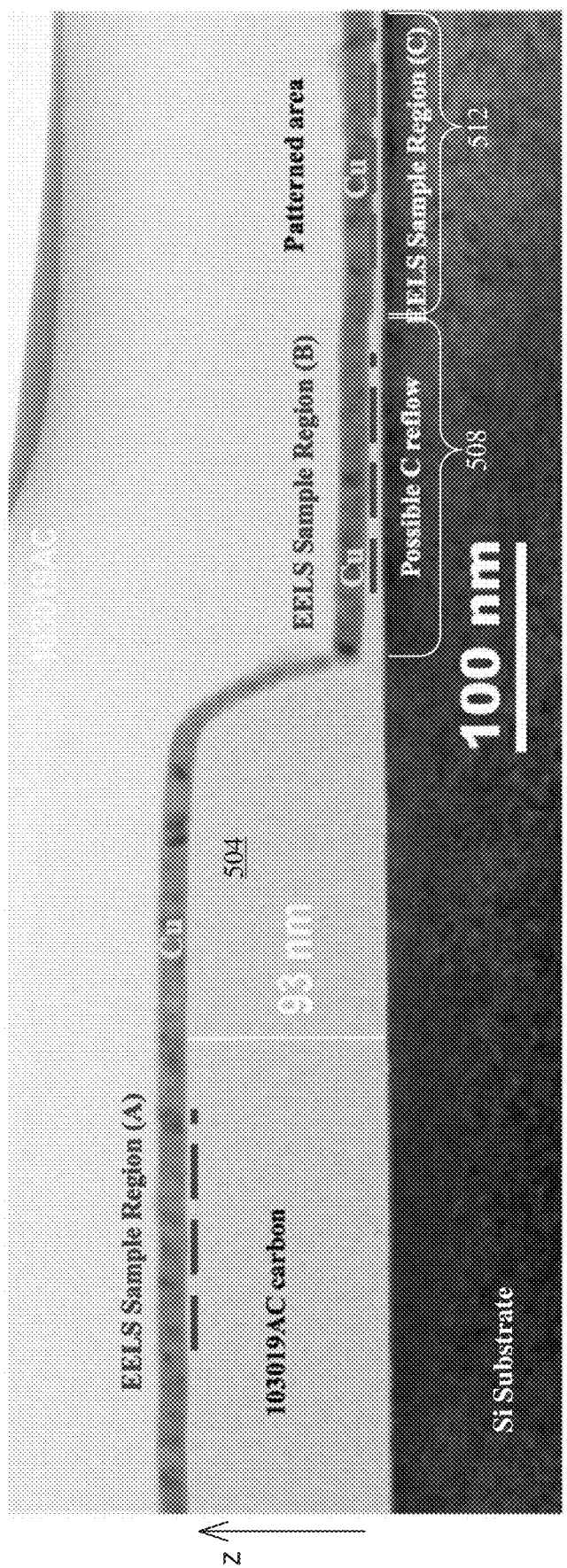
FIG. 5A illustrates a focused ion beam (FIB) STEM micrograph of a cross-section of a sample having thermally treated amorphous carbon deposited on a substrate and as-deposited amorphous carbon deposited on a Cu thin film overlaying the thermally treated amorphous carbon, in accordance with one or more embodiments described herein.

FIG. 5A illustrates a focused ion beam (FIB) STEM micrograph 500 of a cross-section of the prepared sample. Such a cross-section reveals several carbon regions, including a first region 504 having a thickness of about 93 nm and a second region 508 having a thickness of about 6.5 nm. The second region 508 is adjacent to the first region 504. Without intending to be bound by conjecture, the second region can originate from C reflow. The cross-section also reveals a growth region 512 adjacent to the second region 504. Further, the cross-section reveals a growth region 512 adjacent to the second region 508. A layer of $TiN_x$ overlays the substrate surface at the growth region 512. Here, x indicates that the titanium nitride in that layer may be off stoichiometry relative to $TiN_3$. A thickness of about 2.2 nm is observed for the layer of $TiN_x$.

Figure 5B:
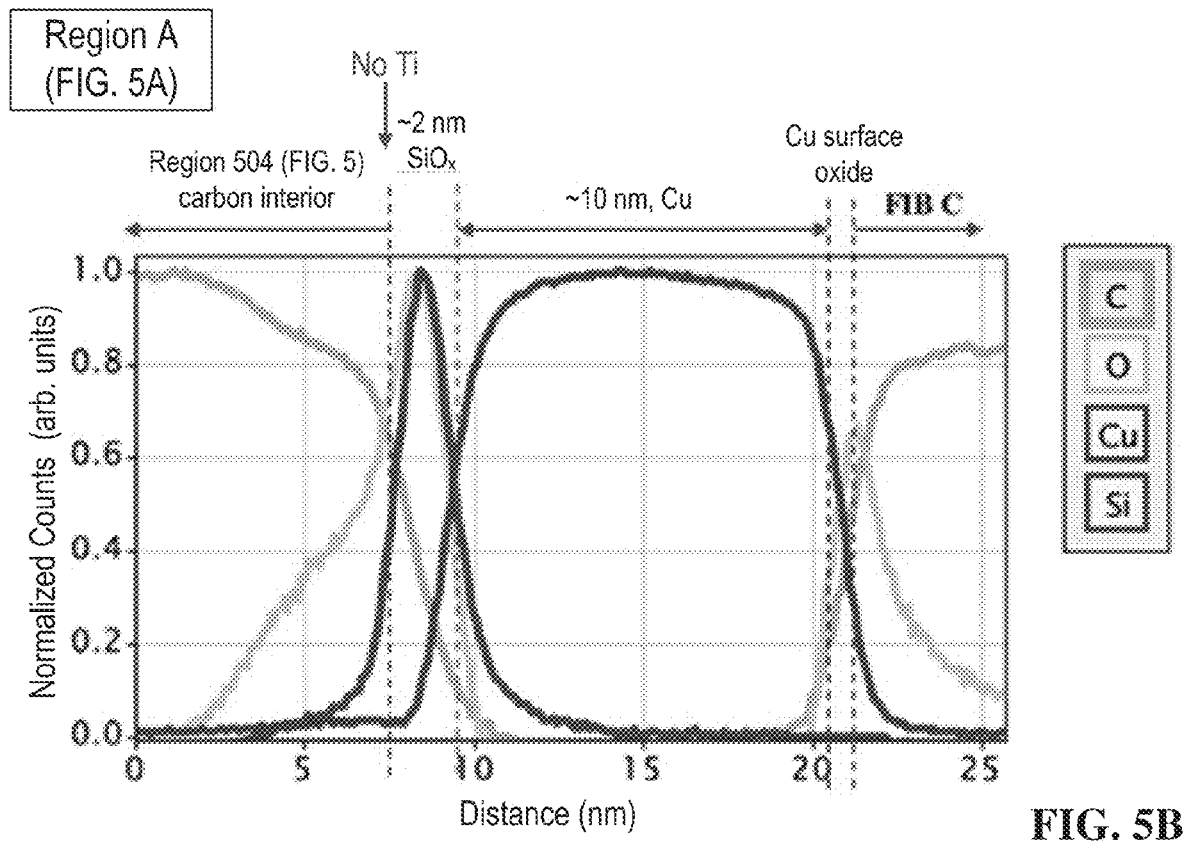
FIG. 5B illustrates a non-limiting example of an EELS spectrum of a region of the sample shown in the micrograph shown in FIG. 5A, in accordance with one or more embodiments described herein.
Figure 5C:
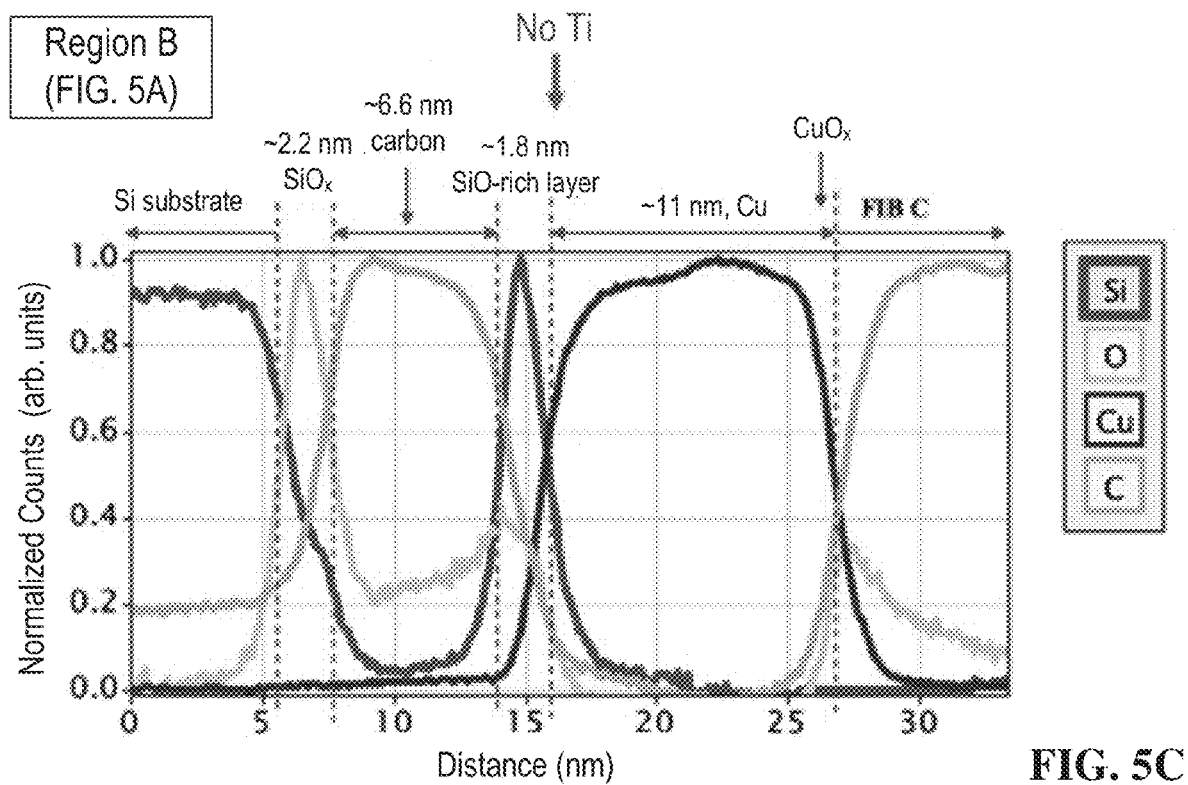
FIG. 5C illustrates a non-limiting example of an EELS spectrum of another region of the sample shown in the micrograph shown in FIG. 5A, in accordance with one or more embodiments described herein.

In connection with EELS experiments, as is shown in FIG. 5B, EELS in Region A within region 504 reveals that Ti is absent from Region A, and thus, it can be concluded that Ti is absent from region 504. In FIG. 5B, the ordinate corresponds to normalized counts and the abscissa corresponds to distance along the z direction shown in FIG. 5A, from an origin within the interior of region 504. Further, as is shown in FIG. 5C, EELS in Region B within region 508 also reveals that Ti is absent from Region B, and thus, it also can be concluded that Ti is absent from region 508. In FIG. 5C, the ordinate corresponds to normalized counts and the abscissa corresponds to distance along the z direction shown in FIG. 5A, from an origin within the interior of the Si substrate.

Figure 5D:
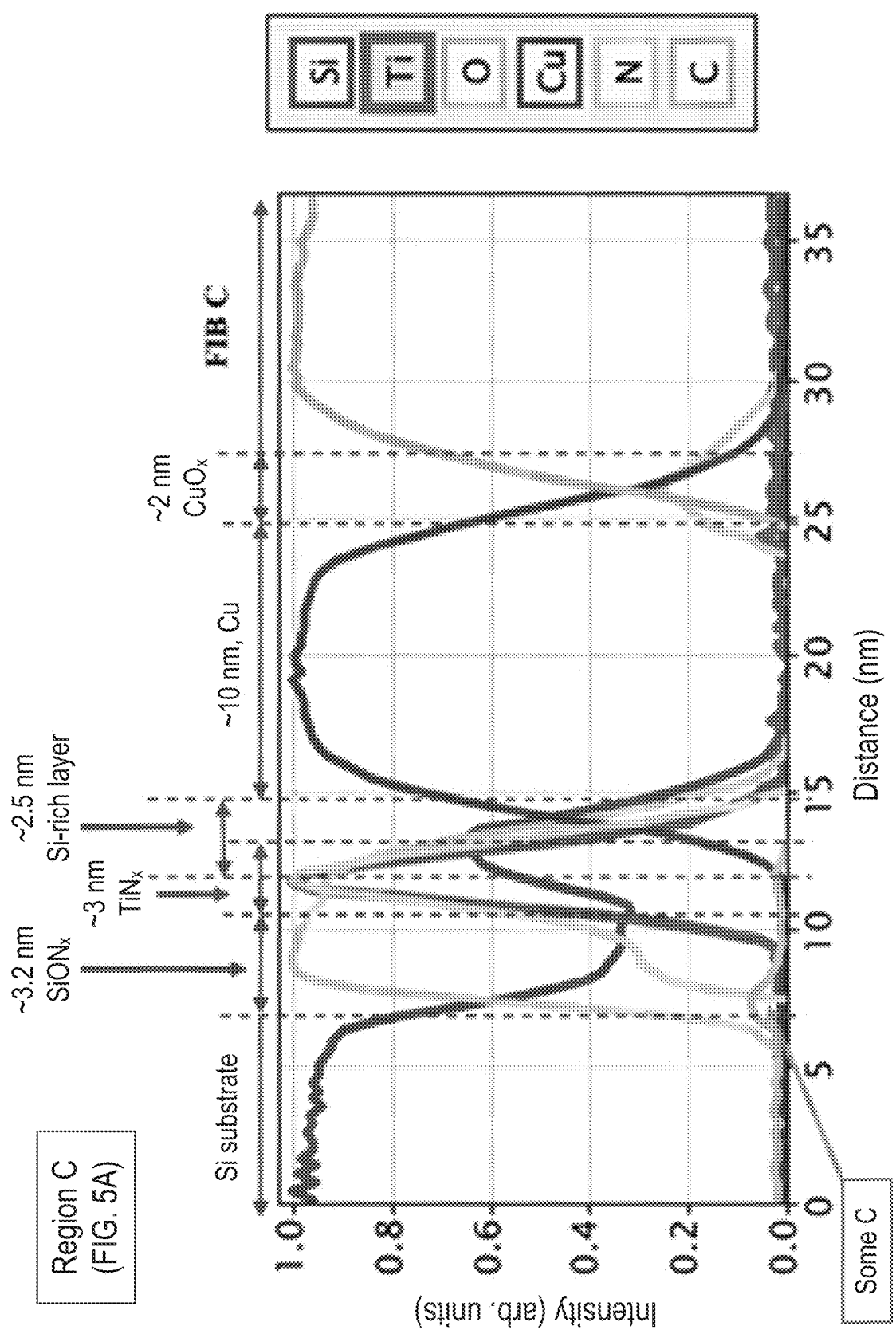
FIG. 5D illustrates a non-limiting example of an EELS spectrum of another region of the sample shown in the micrograph shown in FIG. 5A, in accordance with one or more embodiments described herein.

In sharp contrast, as is shown in FIG. 5D, EELS in Region C within region 512 detects a layer of TiNx having a thickness of about 3 nm. Thus, it can be concluded that region 512 does contain TiNx. In FIG. 5D, the ordinate corresponds to normalized counts and the abscissa corresponds to distance along the z direction shown in FIG. 5A, from an origin within the interior of the Si substrate.

Accordingly, with further reference to FIG. 1, the fabrication process 100 further includes a selective formation stage 150 in which a metal nitride can be selectively deposited using the inhibiting carbon layer 124 to form a superconducting device. Because of the patterned structure of the inhibiting carbon layer 124, the selectively deposited metal nitride can have a uniform thickness t' and can form one or many metal nitride structures. In some embodiments, the thickness t' can have a magnitude in a range from essentially a monolayer of metal nitride to about 80 nm. The metal nitride structure(s) also can be arranged in a pattern and can form a metal nitride layer 154. The pattern of metal nitride structure(s) can constitute a superconducting device. An example of the superconducting device is a superconducting microwave resonator.

Figure 6A:
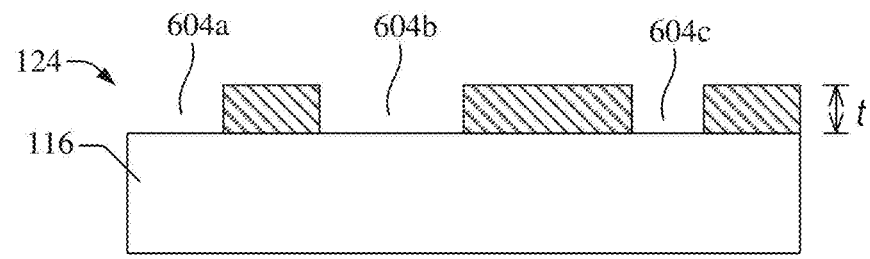
FIGS. 6A to 6C illustrate non-limiting examples of schematic cross-sectional views of structures representative of respective substages that constitute an example selective formation stage included in the fabrication process shown in FIG. 1, in accordance with one or more embodiments described herein. Specifically.
Figure 6B:
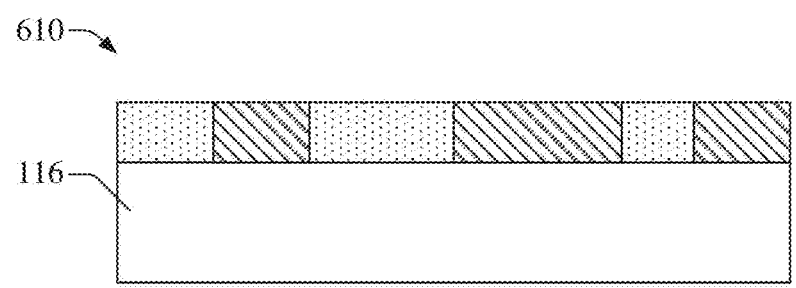

The selective formation stage 150 can include several substages. As is shown in FIG. 6A, a substage can include receiving the inhibiting carbon layer 124. Another substage includes selectively depositing the metal nitride on growth regions (e.g., region 604a, region 604b, and region 604c) present in the inhibiting carbon layer 124. Such a deposition can result in the structure 610 shown in FIG. 6B. As mentioned, the metal nitride can be deposited via an ALD process. Numerous metal nitrides can be selectively deposited in accordance with aspects of this disclosure. In some cases, the metal nitride can be selected from a group including TiN, NbN, TaN, and ZrN. For example, TiN can be selectively deposited. Resulting TiN structures can be superconducting at low temperatures, with a superconducting critical temperature ($T_a$) of about 3 K. As another example, NbN can be selectively deposited. Resulting NbN structures can be superconducting at low temperatures, with a $T_c$ of about 14 K. As yet another example, TaN can be selectively deposited. Resulting TaN structures can be superconducting at low temperatures, with a $T_c$ of about 10 K. As a further example, ZrN can be selectively deposited. Resulting ZrN structures can be superconducting at low temperatures, with a $T_c$ of about 3 K.

In some embodiments, as mentioned, the ALD process to selectively deposit TiN can include causing a thermal reaction between $TiCl_4$ and $NH_3$ at a temperature within a range from about 250° C. to about 400° C. In some cases, the temperature can be about 300° C. In other embodiments, the ALD process to selectively deposit NbN can be enhanced by using hydrogen plasma and can include a niobium precursor containing nitrogen.

Figure 6C:
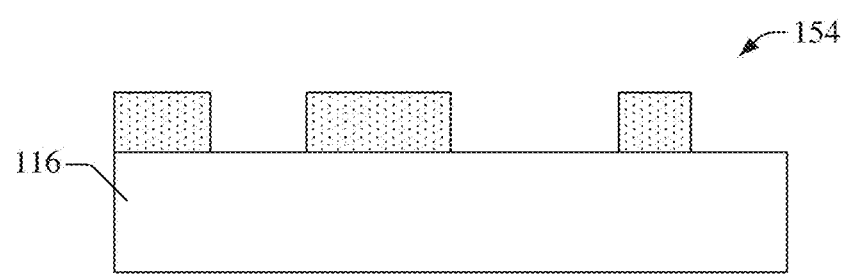

After selectively depositing the metal nitride, the annealed carbon forming the inhibiting carbon layer 124 can be removed in another substage of the selective formation stage 150, as is shown in FIG. 6C. In some embodiments, the annealed carbon can be removed by applying one or several liquids, such as liquid solution of tetramethylammonium hydroxide (TMAH), to the structure 610. The annealed carbon also can be removed by subjecting the structure 610 to a combination of UV light and ozone (UV/O3), O2-plasma, H2-plasma, or N2-plasma. In other embodiments, the amorphous carbon can be removed by using a Ge lift-off layer (not depicted in FIG. 6C).

The pattern or carbonaceous sections present in the amorphous carbon layer 114 can dictate the structure and type of the superconducting device that can be fabricated by implementing the fabrication process 100. As discussed, such a pattern is preserved during the thermal treatment stage 130 that imbues the inhibiting carbon layer 124 with growth inhibiting characteristics. Thus, the growth regions that separate the carbonaceous sections provide areas onto which a metal nitride can be selectively deposited. Therefore, the inhibiting carbon layer 124 can serve as a growth inhibitor layer that can be utilized for area-selective deposition of metal nitrides.

Figure 7A:
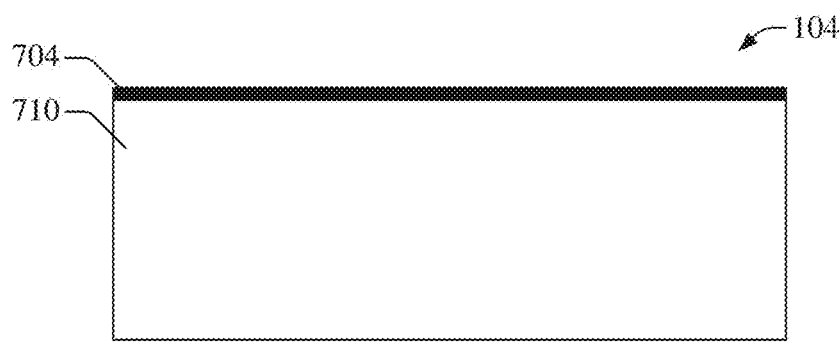
FIGS. 7A to 7F illustrate non-limiting examples of schematic cross-sectional views of structures related to respective substages that constitute an example carbon layer formation stage included in the fabrication process shown in FIG. 1, in accordance with one or more embodiments described herein. Specifically.

For purposes of illustration, FIGS. 7A to 7F illustrate examples of schematic cross-sectional views of structures representative of respective substages of an example of the carbon layer formation stage 110 (FIG. 1), according to some embodiments described herein. A substage of the carbon layer formation stage 110 can include receiving a substrate 104 that can be treated to form the amorphous carbon layer 114 (FIG. 1). In some embodiments, as is illustrated in FIG. 7A, the substrate 104 can include a silicon slab 710 coated with an oxide layer 704 of native oxide (e.g., $SiO_2$). The silicon slab 710 can be embodied in a Si wafer, for example.

Figure 7B:
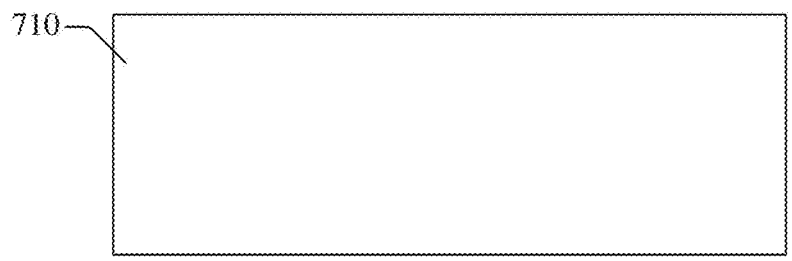

Another substage of the carbon layer formation stage 110 can include removing the oxide layer 704 from the silicon slab 710, thus cleaning the silicon slab 710 for subsequent substages. The clean silicon slab 710 is illustrated in FIG. 7B. The oxide layer 704 can be removed by applying a wet etchant to the substrate 104 for a defined period of time (e.g., two minutes) and subsequently spin rinsing the etched material. Spin rinsing causes the silicon slab 710 to dry. The wet etchant can include an acid, such as hydrofluoric acid. In some cases, the wet etchant can be embodied in 50:1 buffered oxide etchant (BOE). In other cases, the wet etchant can be embodied in 100:1 solution of hydrogen fluoride (HF) and water.

Yet another substage of the carbon layer formation stage 110 can include treating the silicon slab 710 to form a photoresist pattern that exposes some sections of the silicon slab 710 and covers other sections of the silicon slab 710. Such a treatment can include coating the silicon slab 710 with a photoresist material to form a photoresist coating. The photoresist material can be spin coated, in some cases. The photoresist coating can have a uniform thickness of the order of hundred nanometers (e.g., 550 nm). An example of the photoresist material used to form the photoresist coating is polymethylmethacrylate (PMMA).

The treatment also can include forming a photoresist pattern that exposes some sections of the silicon slab 710 and covers other sections of the silicon slab 710. The photoresist pattern can be formed by exposing the photoresist coating to light through a mask defining openings according to the pattern, and subsequently developing the exposed photoresist coating. In some cases, the light can be essentially monochromatic ultraviolet (UV) light. For example, the essentially monochromatic UV light can have a wavelength of about 248 nm. The exposed photoresist can be developed in negative tone, by immersion in a bath of a liquid solution for a defined period of time (e.g., 60 seconds). In some cases, the liquid solution can be 0.26 N TMAH solution, where N denotes normality.

Figure 7C:
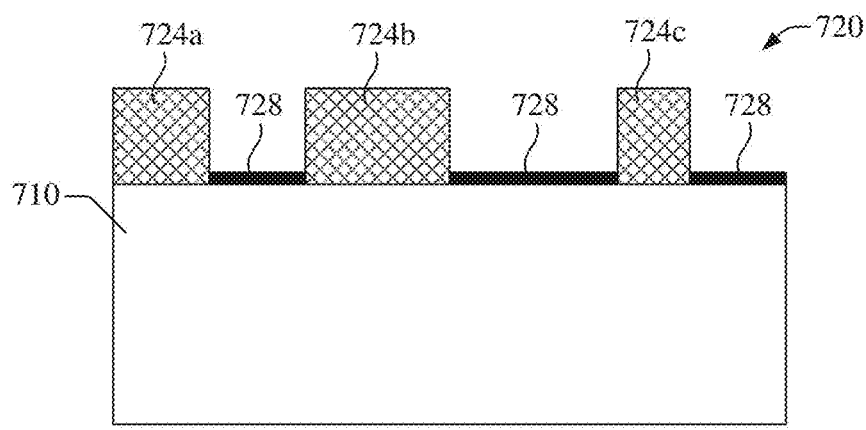

Accordingly, treating the silicon slab can result in a structure 720 as is illustrated in FIG. 7C. The structure 720 includes photoresist sections overlaying the silicon slab 710, including a first section 724a, a second section 724b, and a third section 724c. Those photoresist sections are separated by one or several areas covered in respective native oxide layers overlaying the silicon slab 710. In one example, several native oxide layers 728 can be present, as is shown the FIG. 7C.

Figure 7D:
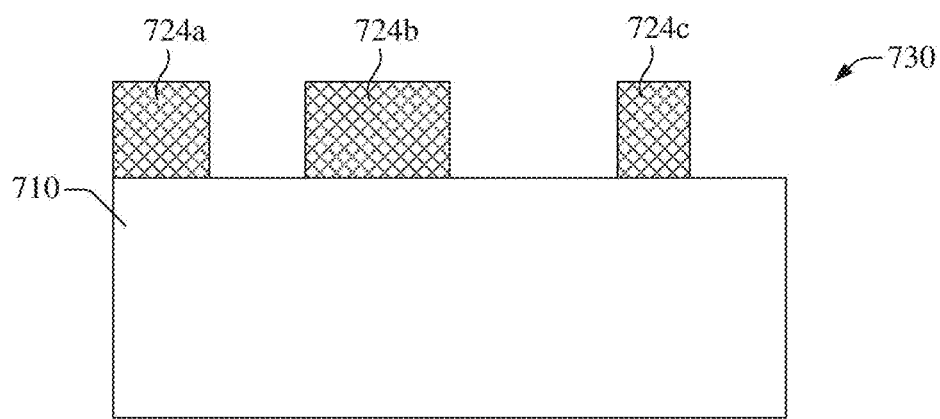

Still another substage of the carbon layer formation stage 110 can include removing the native oxide layers present in the treated silicon slab 710, after formation of the photoresist pattern. Removal of the native oxide layers can result in exposed portions of the surface of the silicon slab 710, as is illustrated in FIG. 7D. Those native oxide layers can be removed by applying a wet etchant to the structure 720 for a defined period of time (e.g., three minutes) and subsequently spin rinsing the etched material. As mentioned, the wet etchant can include an acid, such as hydrofluoric acid. In some cases, the wet etchant can be embodied in 50:1 buffered oxide etchant (BOE). In other cases, the wet etchant can be embodied in 100:1 solution of HF and water. By applying the wet etchant containing HF, a hydrogen terminated surface (not depicted in FIG. 7D) can be produced at the exposed surfaces of the silicon slab 710. As result, satisfactory adhesion with the deposited amorphous carbon can be achieved.

Figure 7E:
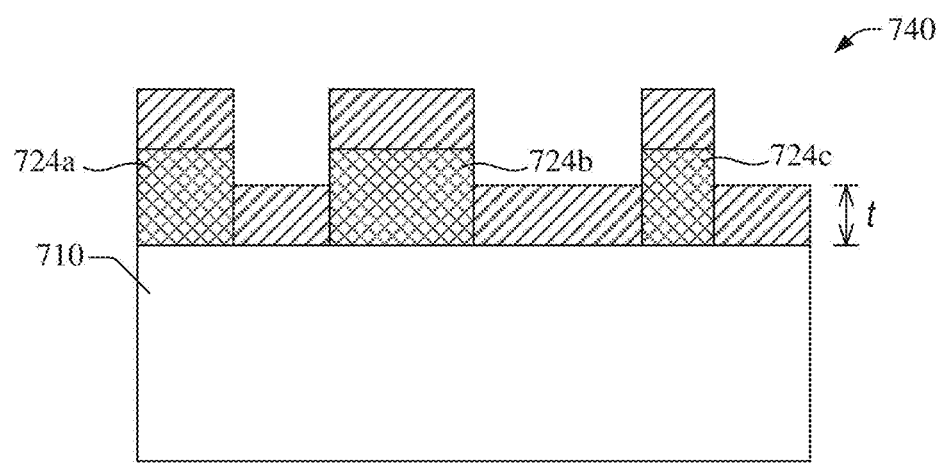

A further substage of the carbon layer formation stage 110 can include depositing amorphous carbon onto the structure 730, resulting in the structure 740 shown in FIG. 7E. As is described herein, the amorphous carbon can be deposited using a PVD process, such as an electron-beam evaporation process. In some configurations, the electron-beam evaporation process can include maintaining a base pressure at about $10^{-7}$ Torr within a deposition chamber, and using a focused electron beam directed to a carbon target (e.g., a target of graphite).

Figure 7F:
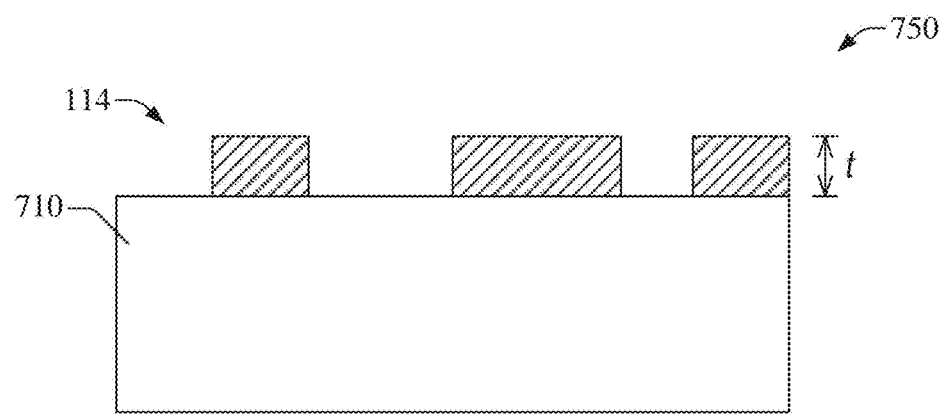

Another substage of the carbon layer formation stage 110 can include removing the photoresist sections from the structure 740, resulting in the structure 750 shown in FIG. 7F. The photoresist sections can be removed using one of many lift-off techniques. In some cases, the photoresist sections can be removed by washing the structure 740 in one or a combination of solvents and then spin drying the resulting structure 750. The solvents can include, for example, N-methyl-2-pyrrolidinone (NMP), a mixture of NMP and a pyrrolidinone compound, and dimethyl sulfoxide (DMSO).

By removing the photoresist sections (e.g., section 724a, section 724b, and section 724c) from the structure 740, a pattern of carbonaceous sections can be formed in the structure 750. That pattern is the negative of the pattern of photoresist sections. In one example, the structure 750 can include the amorphous carbon layer 114 and the pattern of carbonaceous section can be the pattern described above in connection with that layer.

Figure 8:
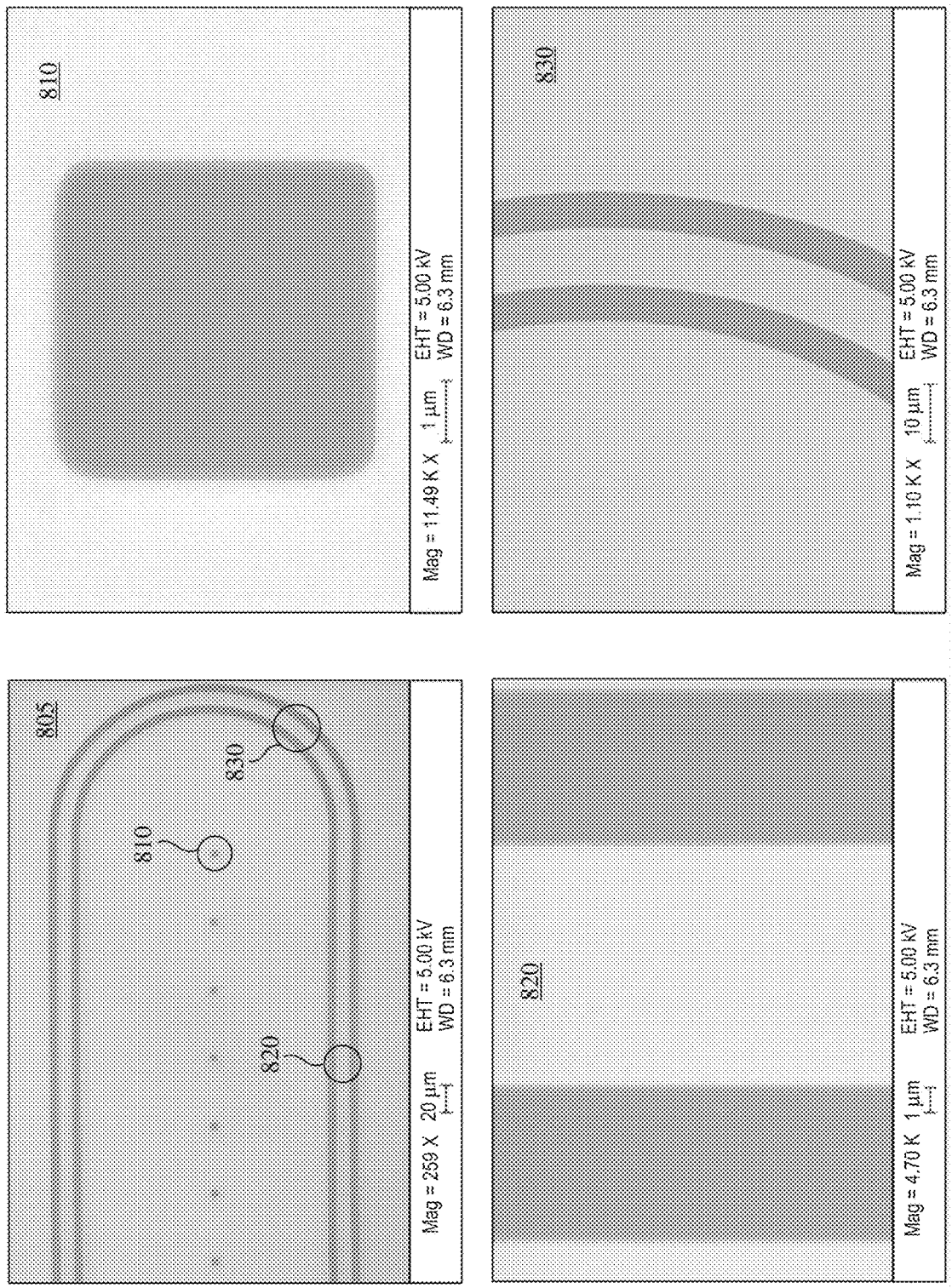
FIG. 8 illustrates SEM images of a non-limiting example of a pattern of carbonaceous sections that can be formed in accordance with aspects of one or more embodiments described herein.

As discussed, the pattern of carbonaceous sections can define a pattern of metal nitride structures that can be selectively deposited using the inhibiting carbon layer 124 (FIG. 1). In one embodiment, the pattern of carbonaceous sections can be formed so that the pattern of metal nitride structures can form a superconducting microwave resonator device. FIG. 8 illustrates SEM images of such a pattern of carbonaceous sections. Dark gray areas in the SEM images correspond to carbonaceous sections. Detail of a section of a SEM image 805 of such a device is shown in panel 810. Detail of another section of the SEM image 805 is shown in panel 820. Detail of yet another section of the SEM image 805 is shown in panel 830.

Figure 9A:
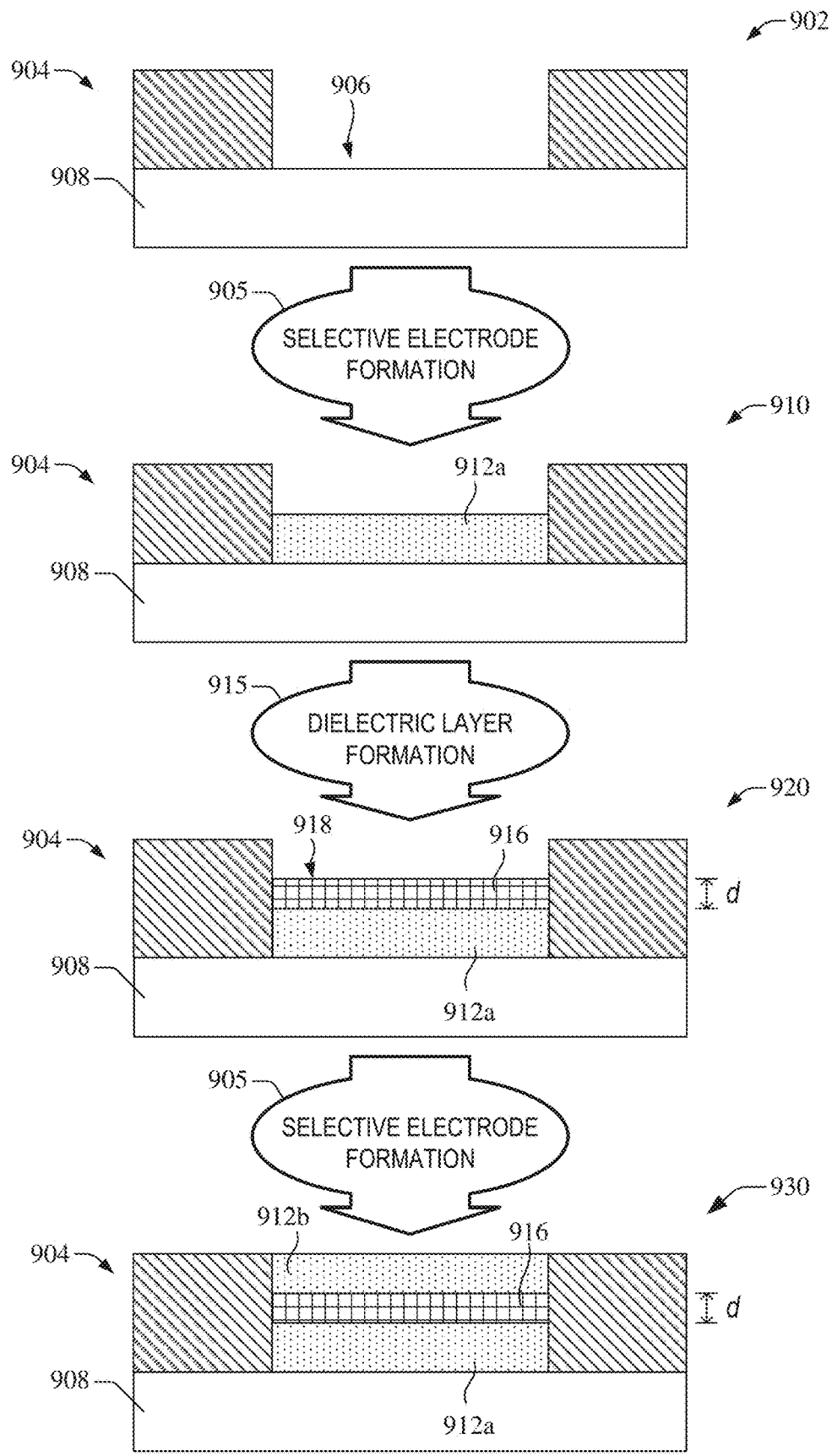
FIG. 9A illustrates a non-limiting example of a process for fabrication of a Josephson junction using the elements of the fabrication process shown in FIG. 1 to form the electrodes of that junction, in accordance with one or more embodiments described herein.

Elements of the fabrication process 100 (FIG. 1) can be combined with other processing stages in order to form other types of superconductor devices that include structural elements besides metal nitride structures. In some embodiments, Josephson junctions can be fabricated. To that end, as is shown in FIG. 9A, a structure 902 can be formed using the carbon layer formation stage 110 and the thermal treatment stage 130 in the fabrication process 100 (FIG. 1). The structure 902 includes an inhibiting carbon layer 904 that has been formed on a substrate 908 in accordance with aspects described herein. The inhibiting carbon layer 904 can include carbonaceous sections defining a grow region 906 (such as a rectangular planar growth region) exposing a surface of the substrate 908. As an illustrations, the substrate 908 can include, a silicon substrate, SiN substrate, a sapphire substrate, or a metal thin film substrate that can be overlaid onto a slab of another material (Si, Ge, a III-V semiconductor, or a II-VI semiconductor, for example).

The structure 902 can be subjected to selective electrode formation stage 905 that can form a metal nitride layer 912a, resulting in the structure 910. The selective electrode formation stage 905 can include selectively depositing a metal nitride on the growth region 906 using an ALD process as is described hereinbefore, for example. In some embodiments, selectively depositing the metal nitride can include causing a thermal reaction between $TiCl_4$ and $NH_3$ at a temperature within a range from about 250° C. to about 400° C. The metal nitride layer 912a can constitute a first electrode. The metal nitride can be superconductor at low temperature. In some cases, the metal nitride can be selected from the group including TiN, NbN, TaN, and ZrN.

The structure 910 can be subjected to a dielectric layer formation stage 915 to form a dielectric layer 916 overlaying the metal nitride layer 912a, resulting in the structure 920. The dielectric layer 916 can have a thickness d and forms a first interface with the metal nitride layer 912a. A magnitude of the distance d can range from about 1.0 nm to about 15 nm. Because the metal nitride that constitutes the metal nitride layer 912a is superconducting at low-temperatures, implementing the dielectric layer formation stage 910 can result in the formation of a first portion of a Josephson junction.

In some embodiments, the dielectric layer formation stage 915 can include an ALD process to deposit the dielectric material that constitutes the dielectric layer 916. As an example, the dielectric material can include a second metal nitride, such as AlN, WN, $Al_2O_3$, ZnO, or $TiO_2$, among others. Accordingly, in some cases, such an ALD process can include depositing aluminum nitride by causing a thermal reaction of a trialkylaluminum compound and ammonia at a temperature in a range from about 250° C. to about 500° C. Other aluminum precursors can be utilized.

The structure 920 can again be subjected to the selective electrode formation stage 905, resulting in the structure 930. The selective electrode formation station 905 can form a metal nitride layer 912b included in the structure 930. As mentioned, the selective electrode formation stage 905 can include selectively depositing a metal nitride on a surface 918 of the dielectric layer 916. The surface 918 can span the entirety of the growth region 906. The metal nitride layer 912b can overlay the entirety of the dielectric layer 916. The metal nitride layer 912b can constitute a second electrode. Although the metal nitride layer 916a and the metal nitride layer 912b are shown as having the same width, the disclosure is not limited in that respect and those structures can have different widths.

The metal nitride forming the metal nitride layer 912b can be deposited using an ALD process as is described hereinbefore, for example. In some embodiments, selectively depositing the metal nitride can include causing a thermal reaction between $TiCl_4$ and $NH_3$ at a temperature within a range from about 250° C. to about 400° C. The metal nitride can be superconductor at low temperature. In some cases, the metal nitride can be selected from the group including TiN, NbN, TaN, and ZrN. Because the metal nitride that constitutes the metal nitride layer 912a is superconducting at low-temperatures, implementing the selective electrode formation stage to form the second electrode can result in the formation of a second portion of the Josephson junction that includes the metal nitride layer 912a.

Figure 9B:
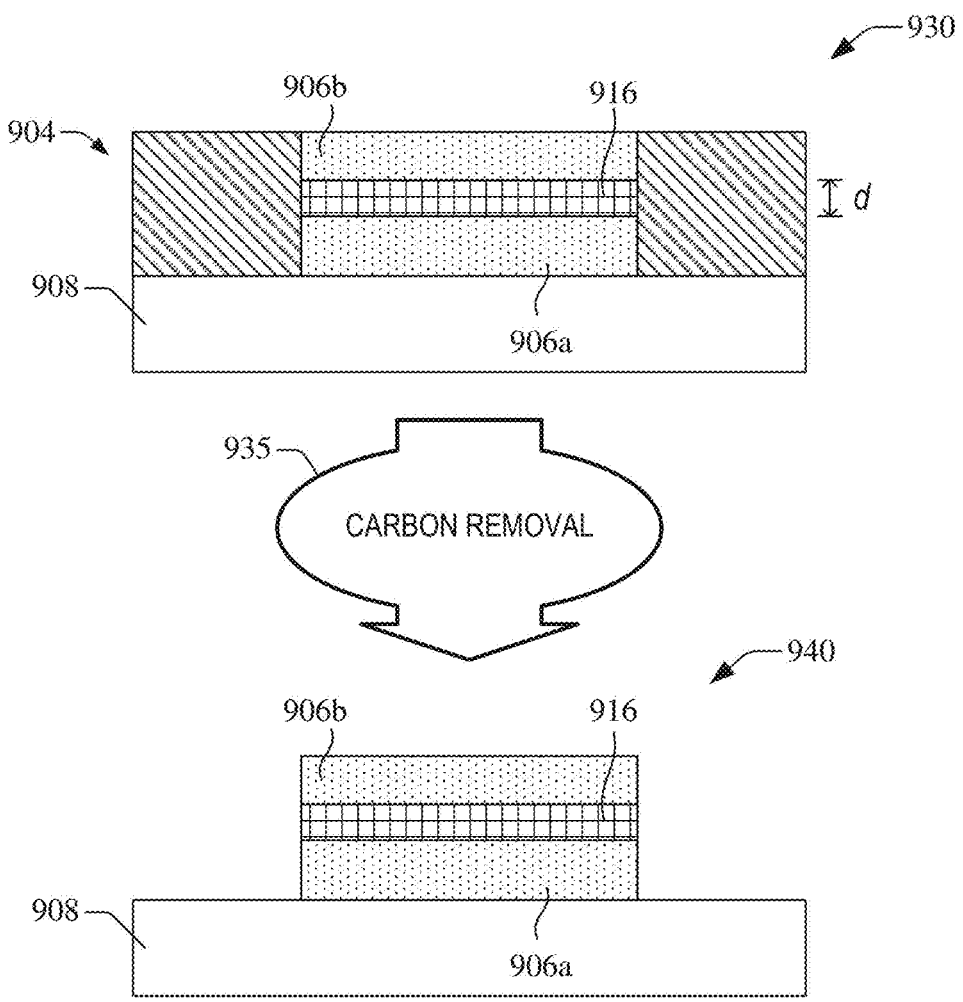
FIG. 9B illustrated a non-limiting example of a stage of a process for fabrication of a Josephson junction, in accordance with one or more embodiments described herein.

As is illustrated in FIG. 9B, the structure 930 can be subjected to a carbon removal stage 935 to remove the annealed carbon present in the inhibiting carbon layer 904. As a result, a Josephson junction 940 can be formed on the substrate 908. In some embodiments, the annealed carbon can be removed by applying one or several liquids, such as liquid solution of tetramethylammonium hydroxide (TMAH), to the structure 930. The annealed carbon also can be removed by subjecting the structure 930 to a combination of UV light and ozone (UV/O3), O2-plasma, $H_2$-plasma, or $N_2$-plasma. In other embodiments, the amorphous carbon can be removed by using a Ge lift-off layer.

Figure 10:
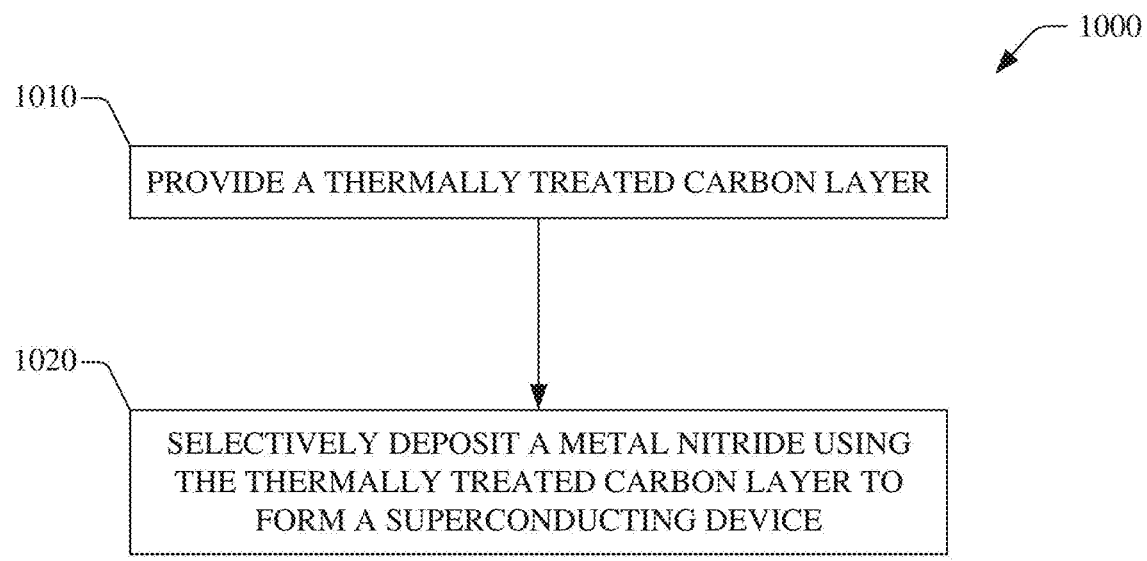
FIG. 10 illustrates a non-limiting example of a method for forming a superconducting device in accordance with one or more embodiments described herein.

FIG. 10 is a flowchart of an example of a method 1000 for fabricating a superconducting device in accordance with one or more embodiments described herein. At block 1010, a thermally treated carbon layer can be provided. The thermally treated carbon layer can overlay a substrate and defines one or several growth regions devoid of carbon. Each one of those growth regions exposes a surface of the substrate. The substrate can be embodied in one or a combination of a Si substrate, a $SiO_2$ substrate, a SiN substrate, a sapphire substrate, or a metal thin film overlaid on slab of a solid material. In some embodiments, the thermally treated carbon layer can be embodied in inhibiting carbon layer 124 (FIG. 1) and the substrate can be embodied in the substrate 104 (FIG. 1).

Providing the thermally treated carbon layer can include depositing a layer of amorphous carbon having a uniform thickness within a range from about 30 nm to about 100 nm. In addition, providing the thermally treated carbon layer includes annealing the layer of amorphous carbon for a period of time at a temperature within a range from about 500° C. to about 1000° C. In some cases, that temperature can be about 900° C., and the period of time can be within a range from about two hours to four hours. As mentioned, the annealing results in an increased proportion of $sp^2$-hybridized carbon-carbon bonds relative to the as-deposited (or untreated) layer of amorphous carbon. In some cases, providing the thermally treated carbon layer can include depositing amorphous carbon onto the substrate using a PVD process, such as an electron-beam evaporation process with a carbon target, in accordance with aspects described above. More specifically, in some embodiments, providing the thermally treated carbon layer can include depositing the thermally treated carbon layer onto the substrate at a base pressure of about $10^{-7}$ Torr using a focused electron beam directed to a graphite target. Providing the thermally treated carbon layer also can include treating the substrate with an acid before depositing the amorphous carbon. The acid can be embodied hydrofluoric acid.

At block 1020, a metal nitride can be selectively deposited using the thermally treated carbon layer to form a superconducting device (e.g., a superconducting microwave resonator or a Josephson junction). In some embodiments, selectively depositing the metal nitride can include causing a thermal reaction between $TiCl_4$ and $NH_3$ at a temperature within a range from about 250° C. to about 400° C. In other embodiments, selectively depositing the metal nitride can include using a plasma enhanced ALD process using hydrogen plasma and a niobium precursor containing nitrogen. As mentioned, the thermally treated carbon layer can define one or several growth regions devoid of carbon. Selectively depositing the metal nitride can include depositing a TiN film onto at least one of the growth region(s).

In some embodiments, selectively depositing the metal nitride can include forming a first metal nitride electrode and forming a second metal nitride electrode adjacent to the first metal nitride electrode. The first and second metal nitride electrodes can be formed concurrently. In addition, selectively depositing the metal nitride also can include forming a Josephson junction. The Josephson junction can be formed by depositing an insulator layer forming a first interface with the first electrode and a second interface with the second electrode, the insulator layer comprising a second metal nitride. For example, the insulator layer can be embodied in a layer of a dielectric material, such as AlN or WN. In some cases, the Josephson function can be formed in accordance with aspects described herein in connection with FIGS. 9A-9B.

Figure 11:
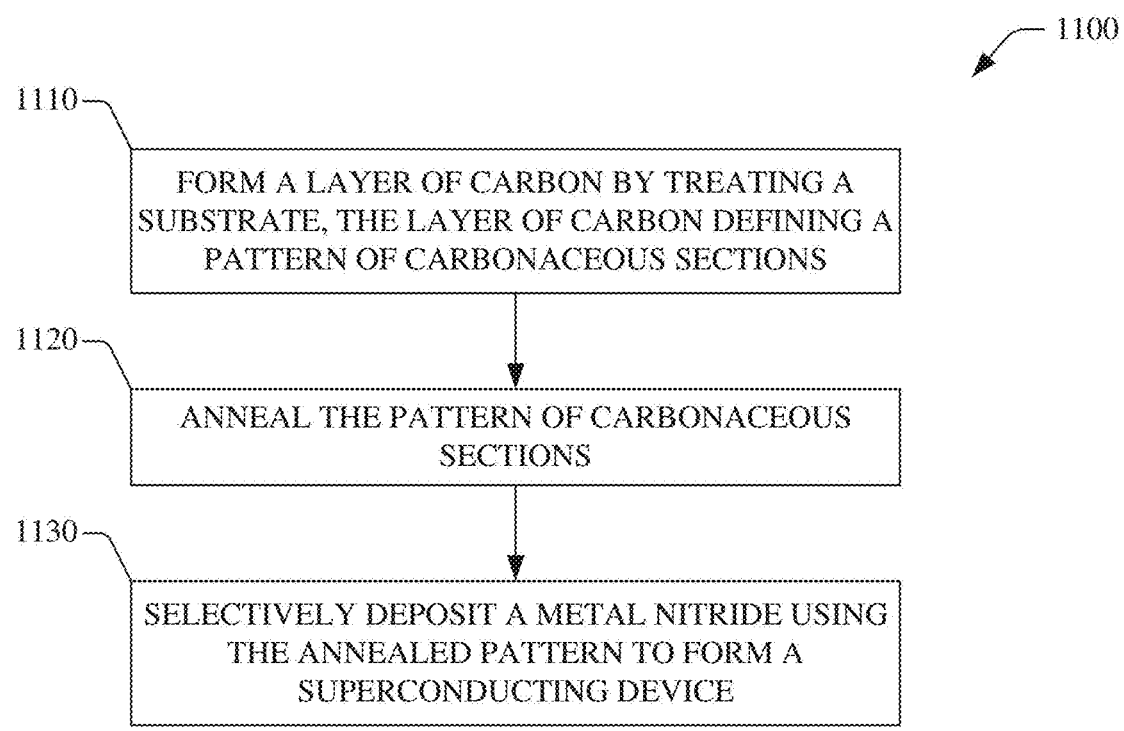
FIG. 11 illustrates a non-limiting example of another method for forming a superconducting device in accordance with one or more embodiments described herein.

FIG. 11 is a flowchart of an example of a method 1100 for fabricating a superconducting device in accordance with one or more embodiments described herein. At block 1110, a layer of carbon can be formed by treating a substrate, wherein the layer of carbon defines a pattern of carbonaceous sections. As is described herein, the substrate can include a Si substrate, a $SiO_2$ substrate, a SiN substrate, a sapphire substrate, or a metal thin film overlaid onto a slab of another material (such as Si, Ge, a III-V semiconductor, or similar).

In some embodiments, the substrate can be treated by implementing the carbon layer formation stage 110 as is described in connection with FIGS. 7A to 7F. Thus, treating the substrate can include applying a photoresist coating to the substrate, and forming the pattern by exposing and developing the photoresist coating. Treating the substrate also can include using an acid to remove exposed portions of a native oxide present on a surface of the substrate, resulting in exposed portions of the surface. The exposed portions of the native oxide can be removed with a wet etchant comprising hydrofluoric acid, in some cases. Treating the substrate can further include depositing amorphous carbon onto the exposed portions of the surface using a PVD process to form the layer of carbon. Because the amorphous carbon is deposited using the patterned photoresist, treating the substrate can further include removing sections of the photoresist coating using at least one of a TMAH solution or a Ge lift-off layer.

At block 1120, the pattern of carbonaceous sections can be annealed. As mentioned, annealing such a pattern can yield an inhibiting carbon layer. Annealing the pattern also can preserve the spatial distribution of carbonaceous sections in the pattern. Thus, the inhibiting carbon layer can be structured accordingly to the pattern. In some embodiments, the pattern can be annealed for a defined period of time at a temperature within a range from about 500° C. to about 1000° C. to yield the inhibiting carbon layer. That temperature can be about 900° C., in some cases.

At block 1130, a metal nitride can be selectively deposited using the annealed pattern of carbonaceous sections to form a superconducting device. Because such an annealed pattern constitutes the inhibiting carbon layer, the metal nitride can be deposited in areas that lack carbon and expose surfaces of the substrate onto which the pattern is overlaid. In some embodiments, selectively depositing the metal nitride can include depositing the metal nitride on the pattern via an ALD process. Numerous metal nitrides can be selectively deposited. In some cases, the metal nitride can be selected from the group including TiN, NbN, TaN, and ZrN.

Figure 12:
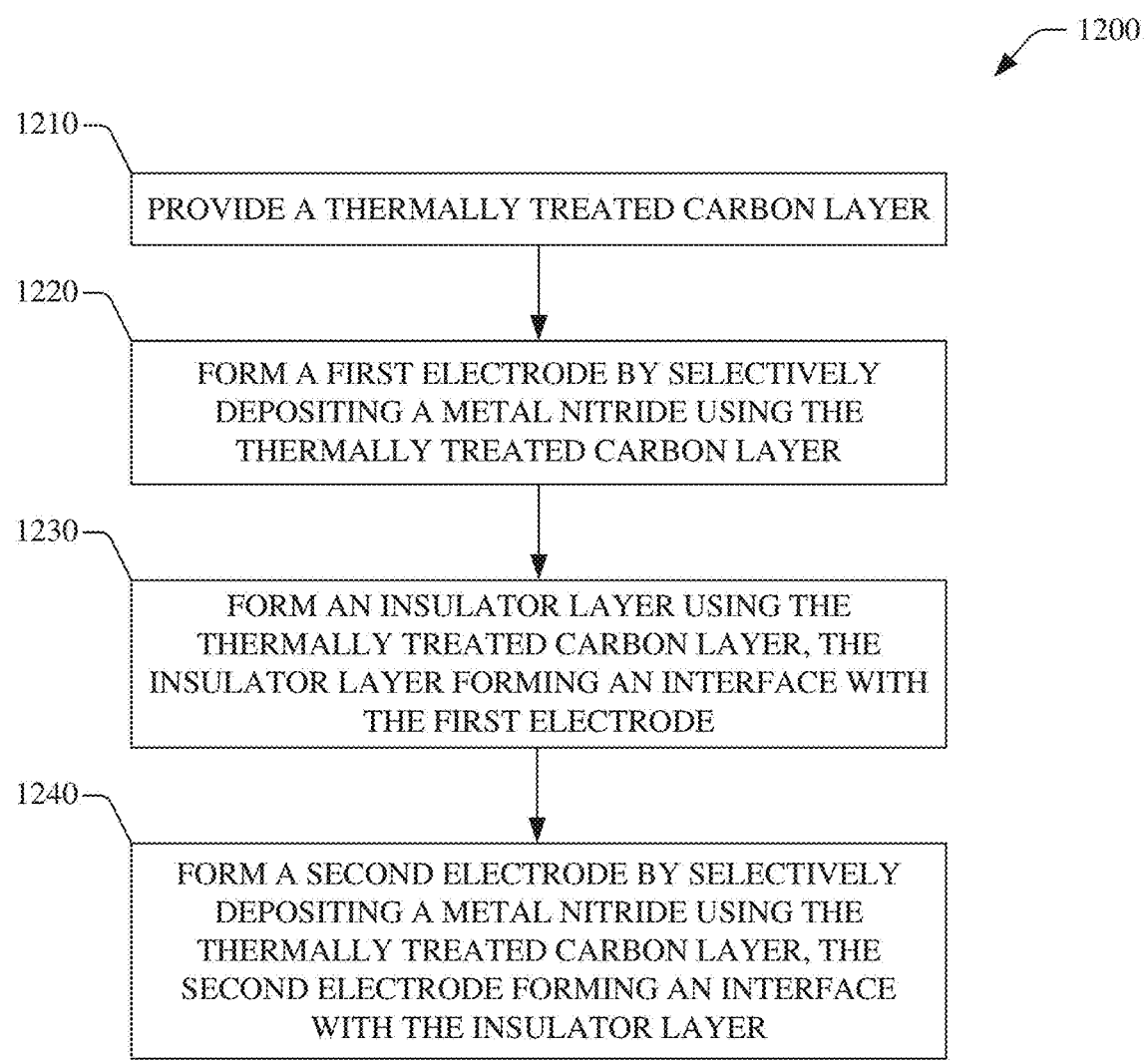
FIG. 12 illustrates a non-limiting example of a method for forming a Josephson junction in accordance with one or more embodiments described herein.

FIG. 12 is a flowchart of an example of a method 1200 for fabricating a Josephson junction in accordance with one or more embodiments described herein. At block 1210, a thermally treated carbon layer can be provided. Similar to other embodiments of this disclosure, the thermally treated carbon layer can overlay a substrate and defines one or several growth regions devoid of carbon. Each one of those growth regions exposes a surface of the substrate. The thermally treated carbon layer can serve as an inhibiting layer that precludes the formation of the metal nitride on a carbonaceous section adjacent to one or more growth regions.

In one embodiment, the thermally treated carbon layer can be provided by implementing the carbon layer formation stage 110, as is described in connection with FIGS. 7A to 7E, to form a patterned layer of amorphous carbon. In addition, the patterned amorphous carbon layer can be subsequently annealed at a temperature within a range from about 500° C. to about 1000° C. to yield the thermally treated carbon layer. In some embodiments, the thermally treated carbon layer can be embodied in the inhibiting carbon layer 124 (FIG. 1).

At block 1220, a first electrode can be formed by selectively depositing a metal nitride using the thermally treated carbon layer. The metal nitride can be superconductor at low temperature. In some cases, the metal nitride can be selected from the group including TiN, NbN, TaN, and ZrN. Because the metal nitride can be superconducting at low temperatures, the first electrode can constitute a first superconducting element included in the Josephson junction being fabricated.

At block 1230, an insulator layer can be formed using the thermally treated carbon layer. The insulator layer can form an interface with the first electrode. In some embodiments, the insulator layer can be formed by implementing the dielectric layer formation stage 915 (FIG. 9A) described herein. Accordingly, in some cases, forming the insulator layer can include selectively depositing a second metal nitride. For example, the metal nitride can be AlN, and selectively depositing the aluminum nitride can include causing a reaction between trimethylaluminum and ammonia to form an AlN layer.

At block 1240, a second electrode can be formed by selectively depositing the metal nitride using the thermally treated carbon layer. The second electrode can form an interface with the insulator layer. By forming the second electrode in such a fashion, a second superconducting element can be provided, thus completing the formation of the Josephson junction being fabricated. In some embodiments, the Josephson junction can be embodied in the Josephson junction 940 (FIG. 9B).

Aspects of the present invention are described herein with reference to flowchart illustrations and/or block diagrams of methods. The flowchart and block diagrams in the Figures illustrate the architecture, functionality, and operation of possible implementations of systems, devices, and methods according to various embodiments of the present invention. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

What has been described above include mere examples of systems, devices, products, and computer-implemented methods. It is, of course, not possible to describe every conceivable combination of components, products, and/or methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method, comprising:
   providing a thermally treated carbon layer;
   selectively depositing a metal nitride using the thermally treated carbon layer for formation of a superconducting device.

2. The method of claim 1, wherein the providing comprises annealing a layer of amorphous carbon at a temperature within a range from about 500° C. to about 1000° C., resulting in formation of sp$^2$-hybridized carbon in the thermally treated carbon layer.

3. The method of claim 1, wherein the selectively depositing comprises causing a thermal reaction between titanium chloride and ammonia at a temperature within a range from about 250° C. to about 400° C.

4. The method of claim 1, wherein the selectively depositing comprises using a plasma enhanced atomic layer deposition process using hydrogen plasma and a niobium precursor containing nitrogen.

5. The method of claim 1, wherein the selectively depositing comprises,
   forming a first electrode; and
   forming a second electrode adjacent to the first electrode, the method further comprising forming a Josephson junction by depositing an insulator layer forming a first interface with the first electrode and a second interface with the second electrode, the insulator layer comprising a second metal nitride.

6. The method of claim 1, wherein the thermally treated carbon layer defines a growth region devoid of carbon and exposing a surface of a substrate, the method further comprising depositing a titanium nitride layer on the growth region.

7. The method of claim 6, wherein the substrate comprises at least one of a SiO$_2$ substrate or a SiN substrate.

8. The method of claim 1, wherein the providing comprises depositing amorphous carbon onto a substrate using an electron-beam evaporation process with a target of graphite.

9. The method of claim 8, wherein the depositing comprises depositing the amorphous carbon onto one of a Si substrate, a sapphire substrate, or a metal thin film.

10. The method of claim 8, further comprising treating the substrate with an acid before depositing the amorphous carbon.

11. The method of claim 10, wherein the treating comprises treating a silicon substrate with hydrofluoric acid.

12. The method of claim 1, wherein the providing comprises depositing a layer of carbon onto a substrate, the layer of carbon having a uniform thickness within a range from about 30 nm to about 100 nm.

13. The method of claim 12, wherein the depositing comprises maintaining a base pressure of about 10$^{-7}$ Torr within a deposition chamber containing the substrate and using a focused electron beam directed to a carbon target.

14. A method, comprising:
   annealing a pattern of carbonaceous sections present in a layer of carbon at a temperature within a range from about 500° C. to about 1000° C.; and
   selectively depositing a metal nitride using the annealed pattern to form a superconducting device.

15. The method of claim 14, wherein the selectively depositing comprises depositing the metal nitride on the pattern via an atomic layer deposition (ALD) process, the metal nitride comprising one of TiN, NbN, TaN, or ZrN.

16. The method of claim 14, further comprising forming the layer of carbon by treating a substrate prior to the annealing, wherein the treating comprises:
   applying a photoresist coating to the substrate;
   forming the pattern by exposing and developing the photoresist coating;
   using an acid to remove exposed portions of a native oxide present on a surface of the substrate, resulting in exposed portions of the surface; and
   depositing amorphous carbon onto the exposed portions of the surface using physical vapor deposition (PVD) to form the layer of carbon.

17. The method of claim 16, further comprising removing the photoresist coating via at least one of a liquid solution of tetramethylammonium hydroxide (TMAH) or use of a Ge lift-off layer.

18. The method of claim 16, wherein removing the exposed portions of the native oxide comprises applying a wet etchant including hydrofluoric acid.

19. A method, comprising:
   forming a first electrode by selectively depositing a metal nitride using a thermally treated carbon layer;
   forming an insulator layer using the thermally treated carbon layer, the insulator layer forming a first interface with the first electrode; and
   forming a second electrode by selectively depositing the metal nitride using the thermally treated carbon layer, the second electrode forming a second interface with the insulator layer.

20. The method of claim 19, wherein forming the insulator layer comprises causing a thermal reaction between trimethylaluminum and ammonia.

* * * * *